United States Patent
Kang et al.

(10) Patent No.: US 9,878,472 B2
(45) Date of Patent: Jan. 30, 2018

(54) METHOD FOR FABRICATING ULTRA-LOW DENSITY THREE-DIMENSIONAL THIN FILM STRUCTURE BASED ON PHOTO-LITHOGRAPHY

(71) Applicant: INDUSTRY FOUNDATION OF CHONNAM NATIONAL UNIVERSITY, Gwangju (KR)

(72) Inventors: Ki Ju Kang, Jeollanam-do (KR); Seung Cheul Han, Gwangju (KR); Min Geun Lee, Jeollabuk-do (KR)

(73) Assignee: INDUSTRY FOUNDATION OF CHONNAM NATIONAL UNIVERSITY, Gwangju (KR)

( * ) Notice: Subject to any disclaimer, the term of this patent is extended or adjusted under 35 U.S.C. 154(b) by 167 days.

(21) Appl. No.: 14/647,849

(22) PCT Filed: Feb. 4, 2013

(86) PCT No.: PCT/KR2013/000873
§ 371 (c)(1),
(2) Date: May 28, 2015

(87) PCT Pub. No.: WO2014/084447
PCT Pub. Date: Jun. 5, 2014

(65) Prior Publication Data
US 2015/0306794 A1   Oct. 29, 2015

(30) Foreign Application Priority Data
Nov. 29, 2012 (KR) .................. 10-2012-0136917

(51) Int. Cl.
*G03F 7/20* (2006.01)
*B29C 41/00* (2006.01)
(Continued)

(52) U.S. Cl.
CPC .............. *B29C 41/003* (2013.01); *B22C 9/12* (2013.01); *B22C 9/22* (2013.01); *B22D 25/02* (2013.01);
(Continued)

(58) Field of Classification Search
CPC .................................................. B29C 67/0051
See application file for complete search history.

(56) References Cited

U.S. PATENT DOCUMENTS

| 6,465,742 B1 | 10/2002 | Hiraoka et al. |
| 2007/0126147 A1 | 6/2007 | Fujikawa et al. |

FOREIGN PATENT DOCUMENTS

| JP | 2004-351608 A | 12/2004 |
| KR | 10-2001-0050467 A | 6/2001 |

(Continued)

OTHER PUBLICATIONS

T. M. Tillotson, L. W. Hrubesh, J. Non-Cryst. Solids, 1992, pp. 44-50, vol. 145, Elsevier Science Publishers B. V.
(Continued)

*Primary Examiner* — Kathleen Duda
(74) *Attorney, Agent, or Firm* — Paratus Law Group, PLLC

(57) ABSTRACT

A method for forming an ultra-low density three-dimensional thin film structure made of a solid thin film, including: radiating ultraviolet rays of different patterns in respective predetermined directions to a liquid photosensitive resin bulk so as to harden a portion of the resin bulk; removing the liquid photosensitive resin which is not hardened so as to form a solid photosensitive resin structure; coating the surface of the solid photosensitive resin structure with a thin film; removing the thin film from the outermost surface of the resin bulk so as to expose the solid photosensitive resin; and removing the solid photosensitive resin structure.

12 Claims, 31 Drawing Sheets

(51) Int. Cl.
    *B29C 35/02* (2006.01)
    *B29C 35/08* (2006.01)
    *G03F 7/00* (2006.01)
    *B22C 9/12* (2006.01)
    *B22C 9/22* (2006.01)
    *B22D 25/02* (2006.01)
    *B28B 1/30* (2006.01)
    *B28B 11/12* (2006.01)
    *B29C 41/02* (2006.01)
    *B29L 31/00* (2006.01)

(52) U.S. Cl.
    CPC ............... *B28B 1/30* (2013.01); *B28B 11/12* (2013.01); *B29C 35/0266* (2013.01); *B29C 35/0805* (2013.01); *B29C 35/0888* (2013.01); *B29C 35/0894* (2013.01); *B29C 41/02* (2013.01); *G03F 7/0035* (2013.01); *G03F 7/0037* (2013.01); *B29C 2035/0827* (2013.01); *B29L 2031/757* (2013.01); *B29L 2031/772* (2013.01)

(56) References Cited

FOREIGN PATENT DOCUMENTS

| KR | 10-2004-0086901 A | 10/2004 |
| KR | 10-0794358 B1 | 1/2008 |
| KR | 10-2011-0087163 A | 8/2011 |
| KR | 10-2012-0021647 A | 3/2012 |

OTHER PUBLICATIONS

J. Zou et al., ACS Nano, Nov. 22, 2010, pp. 7293-7302, vol. 4, American Chemical Society.
B. C. Tappan et al., J. Am. Chem. Soc., Mar. 27, 2006, pp. 6589-6594, vol. 128, American Chemical Society.
T.A Schaedler, et al., Science, Nov. 18, 2011, pp. 962-965, vol. 334, American Association for the Advancement of Science.
Roderic Lakes, Nature, Feb. 11, 1993, pp. 511-515, vol. 361, Nature Publishing Group.
S. Hyun, A. M. Karlsson, S. Torquato, A. G. Evans, Int. J. of Solids and Structures, 2003, pp. 6989-6998, vol. 40, Elsevier Ltd.
International Search Report for PCT/KR2013/000873 dated Aug. 12, 2013 from Korean Intellectual Property Office.

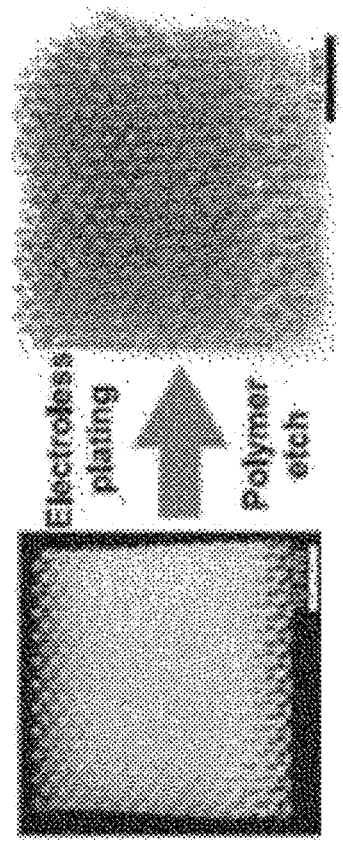
Fig. 4
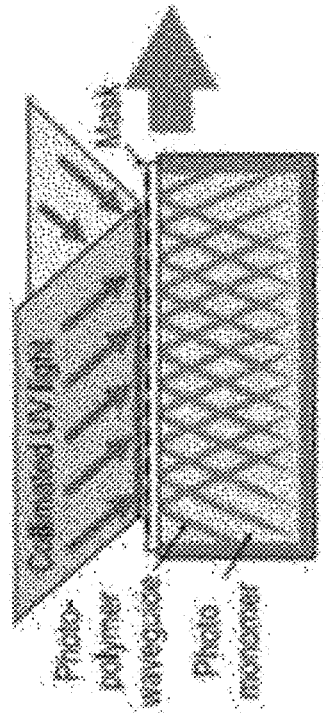
Fig. 5
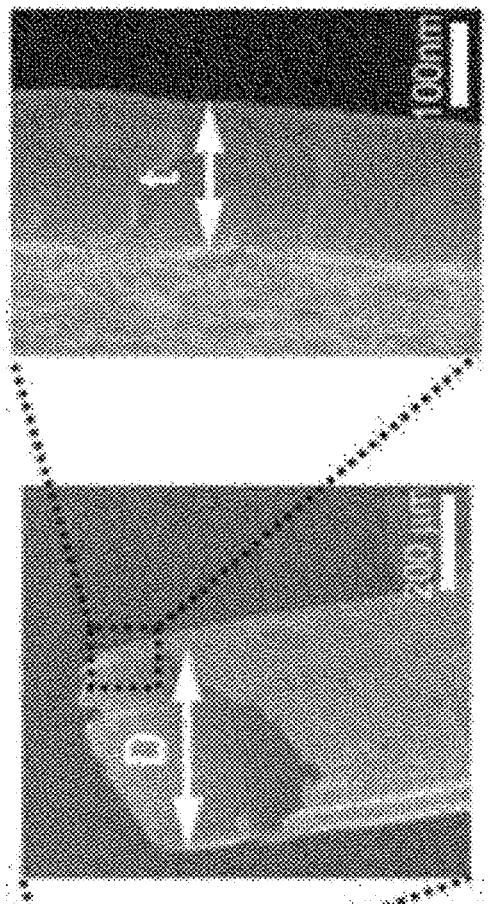
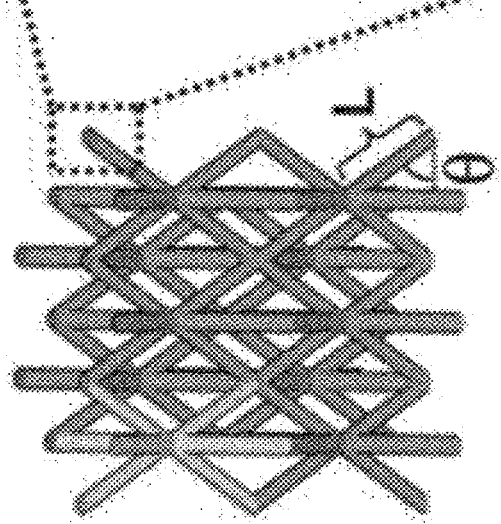

METHOD FOR FABRICATING ULTRA-LOW DENSITY THREE-DIMENSIONAL THIN FILM STRUCTURE BASED ON PHOTO-LITHOGRAPHY

CROSS REFERENCE TO PRIOR APPLICATION

This application is a National Stage Patent Application of PCT International Patent Application No. PCT/KR2013/000873 (filed on Feb. 4, 2013) under 35 U.S.C. §371, which claims priority to Korean Patent Application No. 10-2012-0136917(filed on Nov. 29, 2012) which are all hereby incorporated by reference in their entirety.

TECHNICAL FIELD

The present invention relates to a method for fabricating ultra-low density three-dimensional thin film structure based on photo-lithography.

BACKGROUND ART

Generally, Styrofoam or sponge is known as a representative example of low-density material. The materials each have closed cell and open cell microstructures in a density that is lower than one tenth of the water. The Styrofoam or sponge has been widely used in people's daily lives for many applications including insulation and packaging for more than half a century.

Recently, growing attentions have been placed on a lighter material such as ultra-low dense material including aerogel that is one hundredth the density of water. The aerogel is a porous material consisting of micro-sized cells, which is formed after removing liquid from a gel-type material. FIG. 1 is a photograph of silica aerogel which is called "frozen smoke" for semi-transparent property thereof (T. M. Tillotson, L. W. Hrubesh, J. Non-Cryst. Solids 145, 44, 1992). Meanwhile, in addition to silica, the aerogel can be made from organic material such as metal oxides or polymer, and thanks to ultra-lightweightness, high insulating characteristic and specific surface area thereof, it has found a wide variety of applications including window insulating materials, building materials, tennis rackets, oil-absorbing sponges, etc.

FIG. 2 is structure photograph of the multi-walled carbon nano tube (MWCNT) which is a new aerogel that was introduced early in 2011. MWCNT consists of carbon nano tube (CNT) which is known for superb strength, and has hierarchical structure of micrometer-size cells and nanometer-sized multilayer walls, in a very low density of 4 mg/cm$^3$ (J. Zou et al., ACS Nano 4, 7293, 2010). When filled with resin, MWCNT can be extended to a size that is several thousand times larger than the original size. Accordingly, MWCNT can make highly elastic energy storage, and electric conductivity thereof allows its applications in a variety of fields including high performance sensor or displays, to name just a few.

FIG. 3 illustrates an example of metal foam which is another example of low-density material. In the case of the recently-developed metal foam consisting of nano-sized cells, its density is known to be 8 mg/cm$^3$ (B. C. Tappan et al., J. Am. Chem. Soc. 128, 6589, 2006). Despite heavier weight than aerogel, the metal foam is considered to be the prominent candidate for the electrode material due to conductivity of the metal and high surface area. The metal foam can be made from a variety of metals including iron, cobalt, copper, silver, etc.

Meanwhile, the low-density materials such as Styrofoam, sponge, aerogel or metal foam have degrading strength and stiffness due to defects, i.e., due to the presence of irregular cells therein.

Recently, the Science magazine (November, 2011) introduced a new concept of ultra-low density metal micro-lattice which has ⅟1000 density of the water and which has three-dimensional lattice truss structure (T. A Schaedler, et al., Science, Vol. 334. Pp. 962-965 Nov. 18, 2011). A mask having a regular pattern of micro-holes bored in a liquid photo monomer bulk which solidifies upon exposure to ultraviolet ray, is disposed on a specific surface of the bulk, and then ultraviolet rays are emitted. Upon exposure to a plurality of ultraviolet beams passed through the mask, the liquid photosensitive resin is solidified. The solid photosensitive resin has a higher density than the liquid photosensitive resin, and thus has "self propagating" phenomenon, which means that total reflection of the ultraviolent beam is induced inside the solid photosensitive resin so that the beams are moved straightforwardly without being dispersed. By varying the direction of radiating ultraviolet beams and repeating the above-described process in a plurality of directions, the lattice consisting of solid photosensitive resin is formed inside the liquid photosensitive resin bulk. After removing the liquid photosensitive resin from the solid photosensitive resin lattice, nickel alloy (NiP) is plated on the surface of the solid photosensitive resin lattice by autocatalytic electroless plating. Then the solid photosensitive resin is removed by chemical etching, leaving the micro-lattice as illustrated in FIG. 5. The outer shape of the completed micro-lattice is polyhedron on a several mm scale, but has several hundreds of micro-meter truss elements each having a hollow tubular shape having 100 nano-meter scale wall thickness. The geometric structure of the micro-lattice is identical to the solid photosensitive resin structure as used, and in an aspect of molding, it can be understood to be the engrave manner. The multi-scale hierarchical structure such as micro-lattice is known as the method for achieving lightweightness and high strength (T. Bhat, T. G. Wang, L. J. Gibson, SAMPE J Vol. 25 (1989) pp. 43, R. Lakes. Nature Vol. 361 (1993) pp. 511.).

The micro-lattice is based on photo-lithography which is well-established type of semiconductor manufacturing process and which provides advantages such as ultra-low density, and relatively higher strength and stiffness. However, such a small diameter size of the mask pattern limits penetration of thin-diameter ultraviolet beams to several mm maximum, thus hindering fabrication of the structure on a large scale. Further, because the ultraviolet beams emitted only in out-of-plane direction result in truss elements, the lack of truss elements in an in-plane direction can deteriorate structural stability. FIG. 6 illustrates the collapsing under compression loads exerted on the unit cells of the micro-lattice. The absence of in-plane truss elements at a dotted-location in unit cells causes inability to resist horizontal deformation of the truss elements, and as a result, bending occurs easily.

As a separate way of making three-dimensional multi-porous structure based on lithography, four of the present inventors including Ki-Ju KANG proposed a method of processing a plurality of parallel, hexagonal pillar-form pores in the solid bulk, as disclosed in Korean Patent Registration No. 0794358. Specifically, among total six directions including three in-plane directions having 60 or 120 degree azimuth, and three out-of-plane directions, the method processes hexagonal pillar form of pores in three to six directions. FIG. 7 illustrates the shapes in each stage of processing hexagonal pillar form of pores in one to four directions. The final resultant form of fabricated structure is similar to the three-dimensional Kagome truss (S. Hyun, A. M. Karlsson, S. Torquato, A. G. Evans, 2003. Int. J. of Solids and Structures, Vol. 40, pp. 6989-6998). The method for processing hexagonal pillar form of pores includes not only the macro processing technique such as electric discharge processing, high energy particle processing, or laser processing, but also ultrafine processing technique such as high aspect ratio (HAR) MEMS which can process micrometer-scale pores. FIG. 9 schematically illustrates processing pores with mask used in high energy particle processing and entrance of two-directional high energy beams. However, the high energy particle processing takes considerable amount of cost, while it is applicable in extremely limited field of technology. The rest methods are also quite disadvantageous, in cost and practical aspects, for processing elongated, hexagonal pillar form of pores with micro-apertures. Further, when fabricated by these methods, the resultant three-dimensional porous structures reach only 50% to 70% of porosity.

DISCLOSURE

Technical Problem

The present invention has been made to solve the problems occurring in the prior art explained above, and accordingly, it is an object of the present invention to provide a method for fabricating ultra-low density three-dimensional thin film structure based on photo-lithography, having high strength and stiffness compared to weight, and also having large surface area, in which a plurality of regular three-dimensional polyhedrons consisting of thin films having several hundred nanometers of wall thickness are formed in a regular arrangement in a space.

Technical Solution

In the process of developing three-dimensional thin film structure having polyhedron form of unit cell lattice that can minimize density without compromising mechanical strength, the present inventors recognized that it is necessary to realize a hollow form of unit cell lattice, as this can minimize the weight of the unit cell lattice, while maintaining the volume of the unit cell lattice at a constant level considering mechanical strength. Meanwhile, the inventors have prepared models of the three-dimensional thin film structure having regular cell lattices in polyhedron form and observed the same, and in that process, were able to confirm that hollow spaces of the structure were observed through the penetrations in a certain pattern in a certain direction. Using these hollow spaces as a mold, the inventors attempted a method of fabricating thin film structures in which the inventors applied micro-lattice fabrication method using photo-lithography to prepare the mold by forming the penetrated spaces into solid phase in the thin film structure model with the photo-lithography, and discovered the possibility of forming thin film structure having hollow polyhedron unit cells into an engraved structure by molding.

In order to achieve the above-mentioned objectives, a method for forming an ultra-low density three-dimensional thin film structure made of a solid thin film is provided, which may include the steps of radiating ultraviolet rays of different patterns in respective predetermined directions to a liquid photosensitive resin bulk so as to harden a portion of the resin bulk, removing the liquid photosensitive resin which is not hardened so as to form a solid photosensitive resin structure, coating the surface of the solid photosensitive resin structure with a thin film, removing the thin film from an outermost surface of the resin bulk so as to expose the solid photosensitive resin, and removing the solid photosensitive resin structure. Each of the different patterns has a structure in which predetermined polygonal shapes are arranged in the vicinity of and alternately with each other. The solid photosensitive resin structure has a structure in which a plurality of prisms intersects with each other. The ultra-low density three-dimensional thin film structure made of a solid thin film has a structure in which hollow polyhedron unit cells having surfaces with a flat surface element are interconnected and repeatedly formed, thus enabling the ultra-low density three-dimensional thin film structure to be formed into an engraved structure relative to the solid photosensitive resin structure.

The radiating the ultraviolet rays may use one or more masks with different patterns to each other.

The radiating the ultraviolet rays may use maskless lithography technique.

The radiating the ultraviolet rays may be performed only on a specific plane of the liquid photosensitive resin bulk, according to respective patterns and in respective designated directions.

The radiating the ultraviolet rays may be performed on two or more planes of the liquid photosensitive resin bulk, according to respective patterns and in respective designated directions.

The thin film may be formed of metal, ceramic or polymer.

The step of coating the surface of the solid photosensitive resin structure with the thin film may include forming a multilayered thin film by repeatedly performing with a homogeneous or heterogeneous material.

After the multilayered thin film is formed, the method may additionally include a chemical, physical or thermal post-processing to mitigate interlayer stress or to suppress interlayer separation.

Either an inner space as occupied by the hollow polyhedron unit cells or an outer space, or both may be filled with a porous material.

The removing the thin film from the outermost surface of the resin bulk may be performed in a mechanical polishing, electrolytic polishing or chemical etching manner.

The removing the solid photosensitive resin structure may be performed in one of chemical, physical, thermal and optical manners.

The unit cells may be one of tetrahedron, cube, octahedron, vector equilibrium, rhombic dedecahedron, and Kagome.

Advantageous Effects

According to the present invention, using solid photosensitive resin structure having a plurality of intersecting prisms as a mold, the ultra-low density three-dimensional thin film structure can be formed by engrave coating, thus having a structure of repeated, interconnected hollow polygon unit cells having flat surface elements on surfaces.

This ultra-low density three-dimensional thin film structure can be utilized as lightweight structure for its higher strength and stiffness compared to weight, and also can be utilized for the purpose of heat transmission medium or catalytic supports for its large specific surface area.

Further, unlike the conventional micro-lattice fabrication method, the fabrication method of the present invention enables large-size production, as it uses mask holes in relatively larger apertures, thus allowing the ultraviolet rays radiated through the holes to be penetrated deeper into the resin.

BRIEF DESCRIPTION OF THE DRAWINGS

FIG. 4 is a schematic view of a process of manufacturing conventional micro-lattice.

FIG. 5 illustrates a structure of conventional micro-lattice.

MODE FOR EMBODYING THE INVENTION

Figure 1:
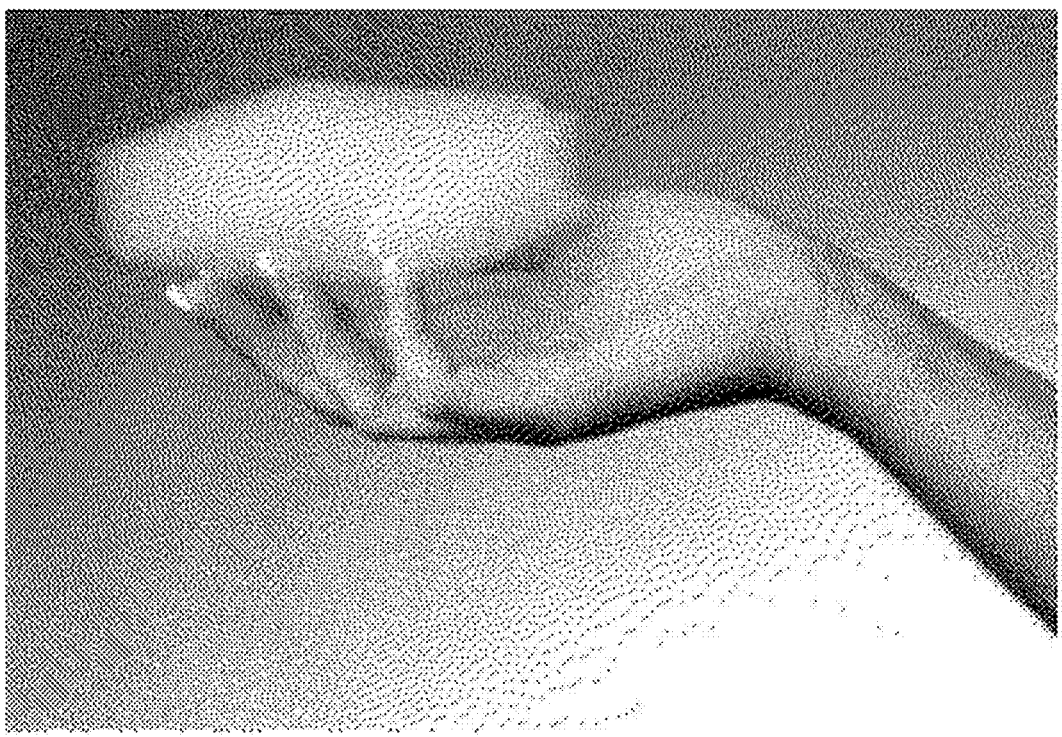
FIG. 1 is a photograph of a conventional silica aerogel product.
Figure 2:
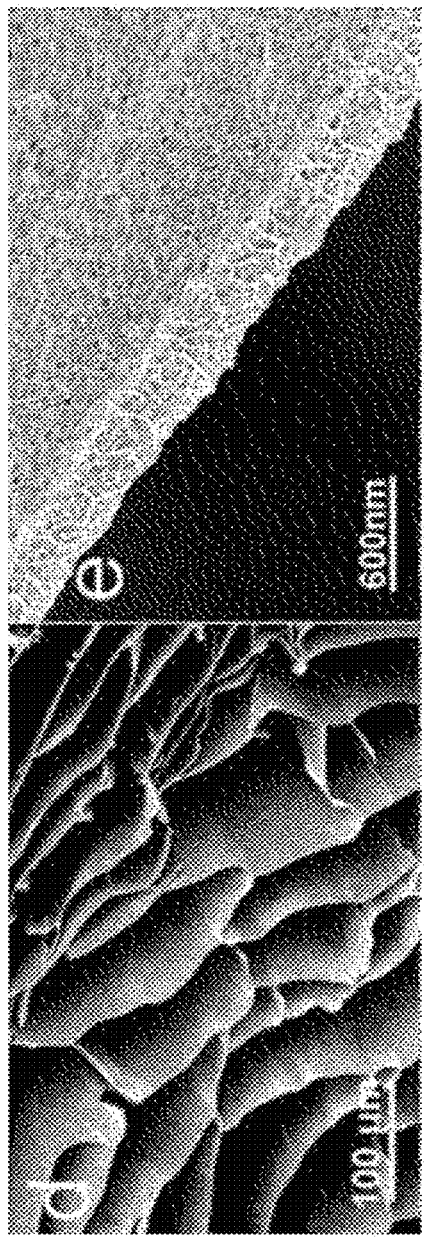
FIG. 2 is a microstructure photograph of conventional multi-walled carbon nano tube (MWCNT).
Figure 3:
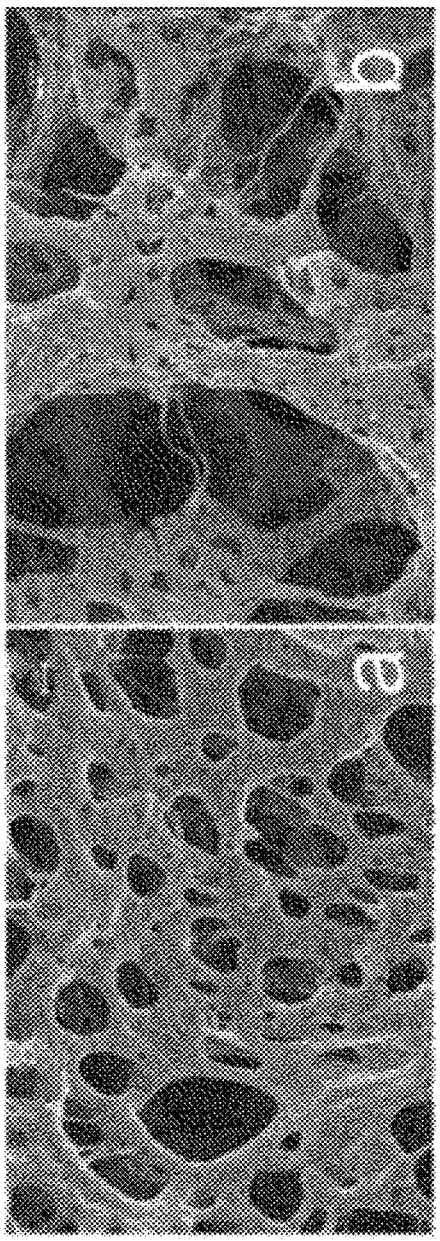
FIG. 3 is a microstructure photograph of conventional porous metal foam consisting of nano-sized cells.
Figure 6:
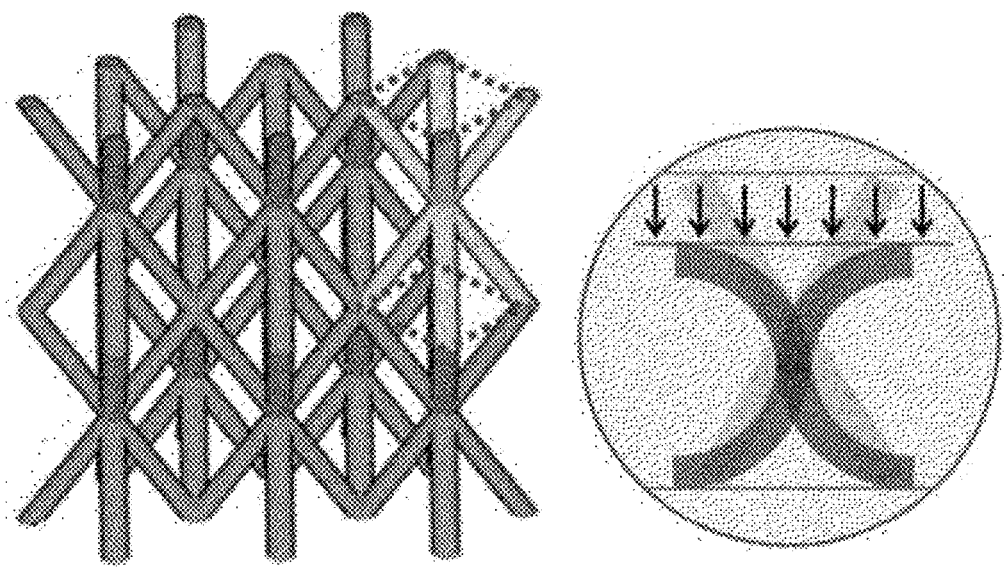
FIG. 6 is a diagram illustrating collapse of conventional micro-lattice under compression load exerted thereon.
Figure 7:
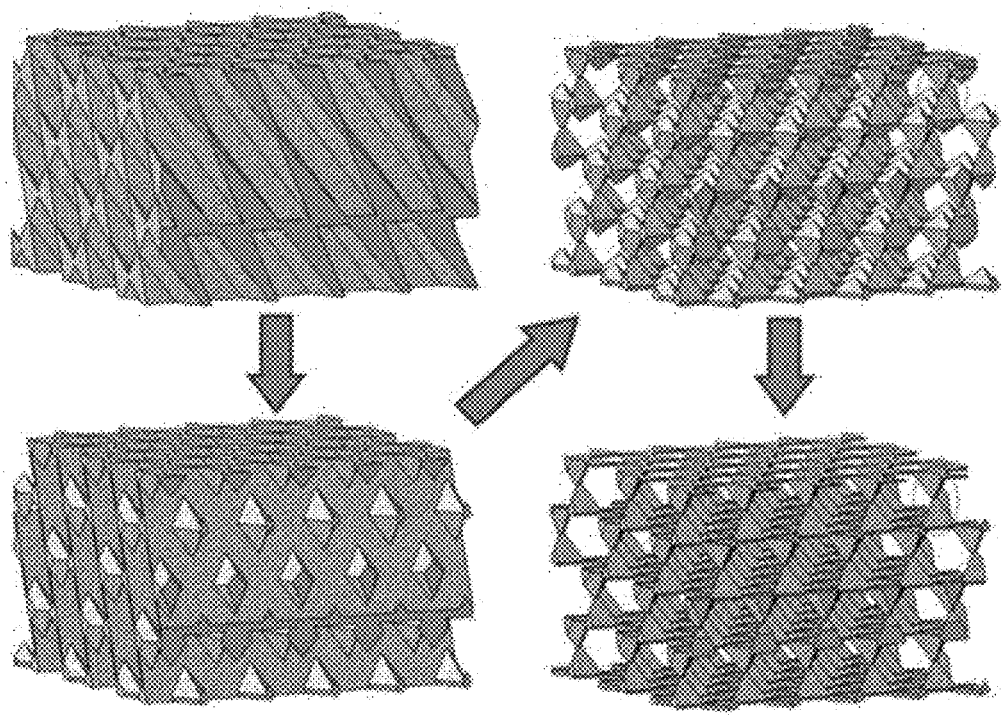
FIG. 7 is a diagram illustrating stages of processing light-weight structure as disclosed in KR Registered Patent No. 0794358.
Figure 8:
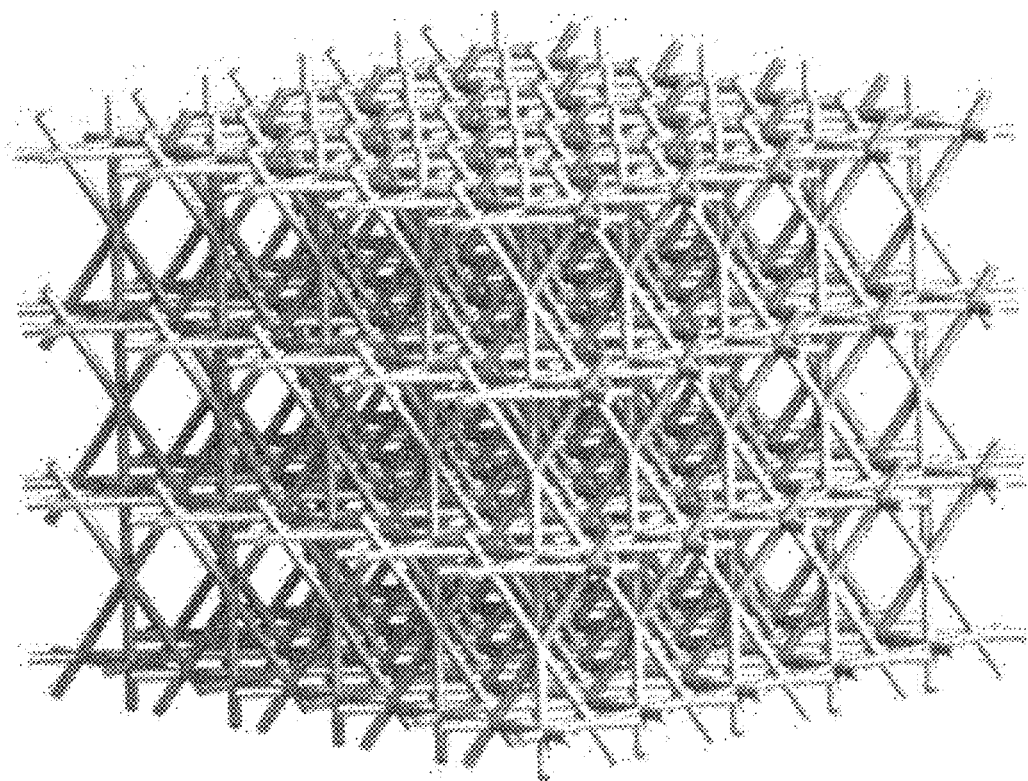
FIG. 8 illustrates three-dimensional Kagome truss-shaped lightweight structure fabricated according to FIG. 7.
Figure 9:
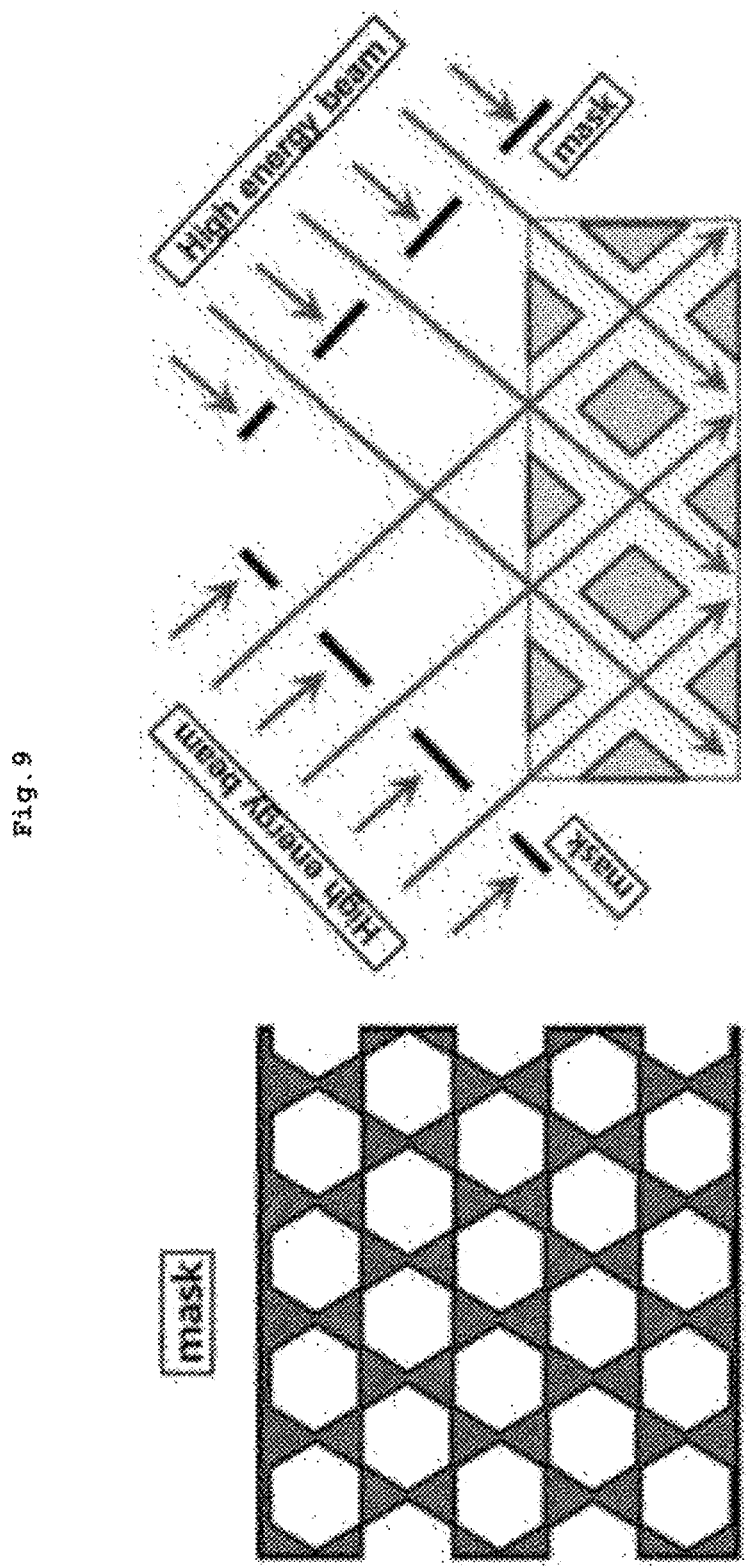
FIG. 9 is a diagram illustrating fabrication by means of the mask and high energy beams as disclosed in KR Registered Patent No. 0794358.

Hereinafter, the present invention will be explained in more detail with reference to the following Examples. However, the following Examples are only provided only for illustrative purpose, and therefore, do not limit the scope of the present invention. Further, certain illustrations in the drawings are omitted as these are irrelevant to the present disclosure, and throughout the description, the like elements will be referred by the similar reference numerals.

Figure 10:
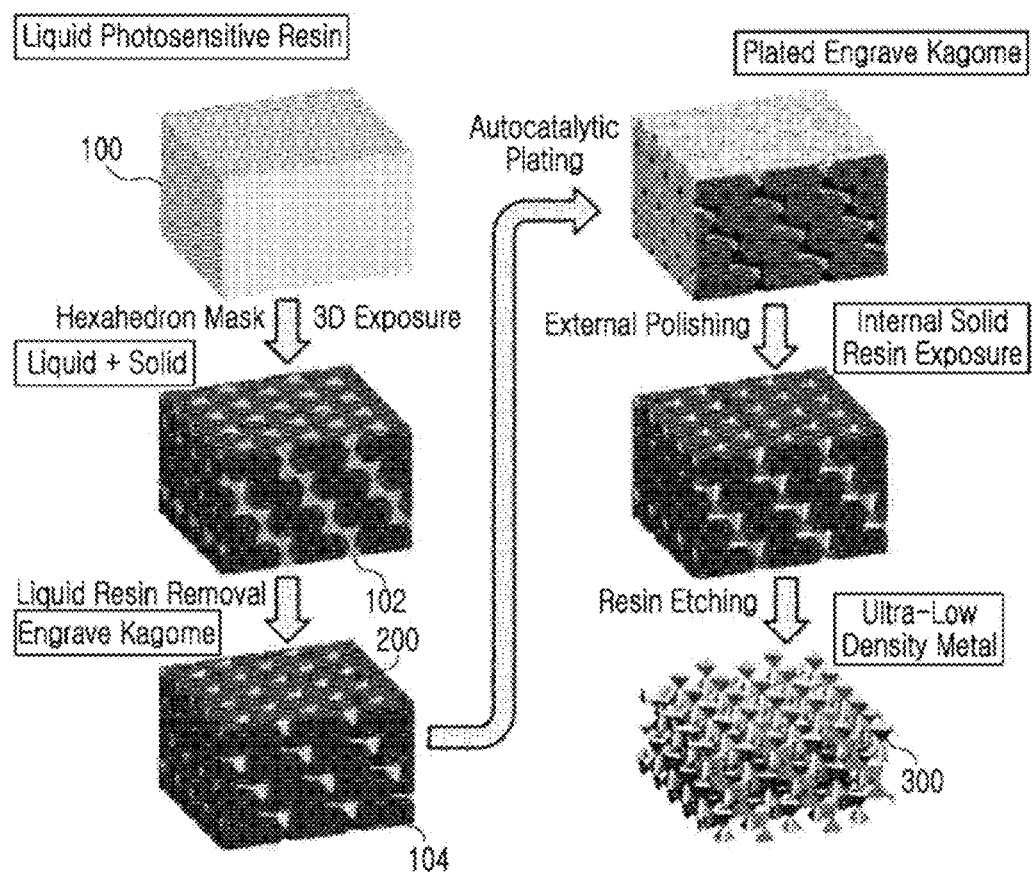
FIG. 10 is a schematic view illustrating a method for fabricating ultra-low density three-dimensional thin film structure according to the present invention.

FIG. 10 is a schematic view of a method for fabricating ultra-low density three-dimensional thin film structure according to the present disclosure.

First, one or more masks (not illustrated) having different patterns to each other are radiated along respectively predetermined directions on a liquid photosensitive resin bulk 100. Like the conventional micro-lattice forming process, due to higher density of the solid photosensitive resin than the liquid photosensitive resin, the "self propagating" phenomenon occurs in which the ultraviolet beams undergo total reflection and are headed straightforward to penetrate throughout the liquid photosensitive resin bulk 100, thus forming solid photosensitive resin in a prism form that corresponds to the mask pattern. Meanwhile, the liquid photosensitive resin bulk 100 may be properly maintained in the space, while being received in a receptacle (not illustrated).

Next, the un-hardened, liquid photosensitive resin 102 is poured out, leaving the solid photosensitive resin structure 104. An empty space 200 is defined within the solid photosensitive resin structure 104, from which the liquid photosensitive resin 102 is removed.

The resultant structure of the structure 104 and the hollow polyhedron unit cells that construct the corresponding structure 104 may be determined according to the shape of the respective masks as used, shapes of arrangement of the masks with respect to the photosensitive resin bulk, and the direction of ultraviolet radiation. Further, the shapes of arrangement of the mask includes on which surface of the photosensitive resin bulk the corresponding mask is arranged, and in which direction the corresponding mask is arranged.

Figure 13:
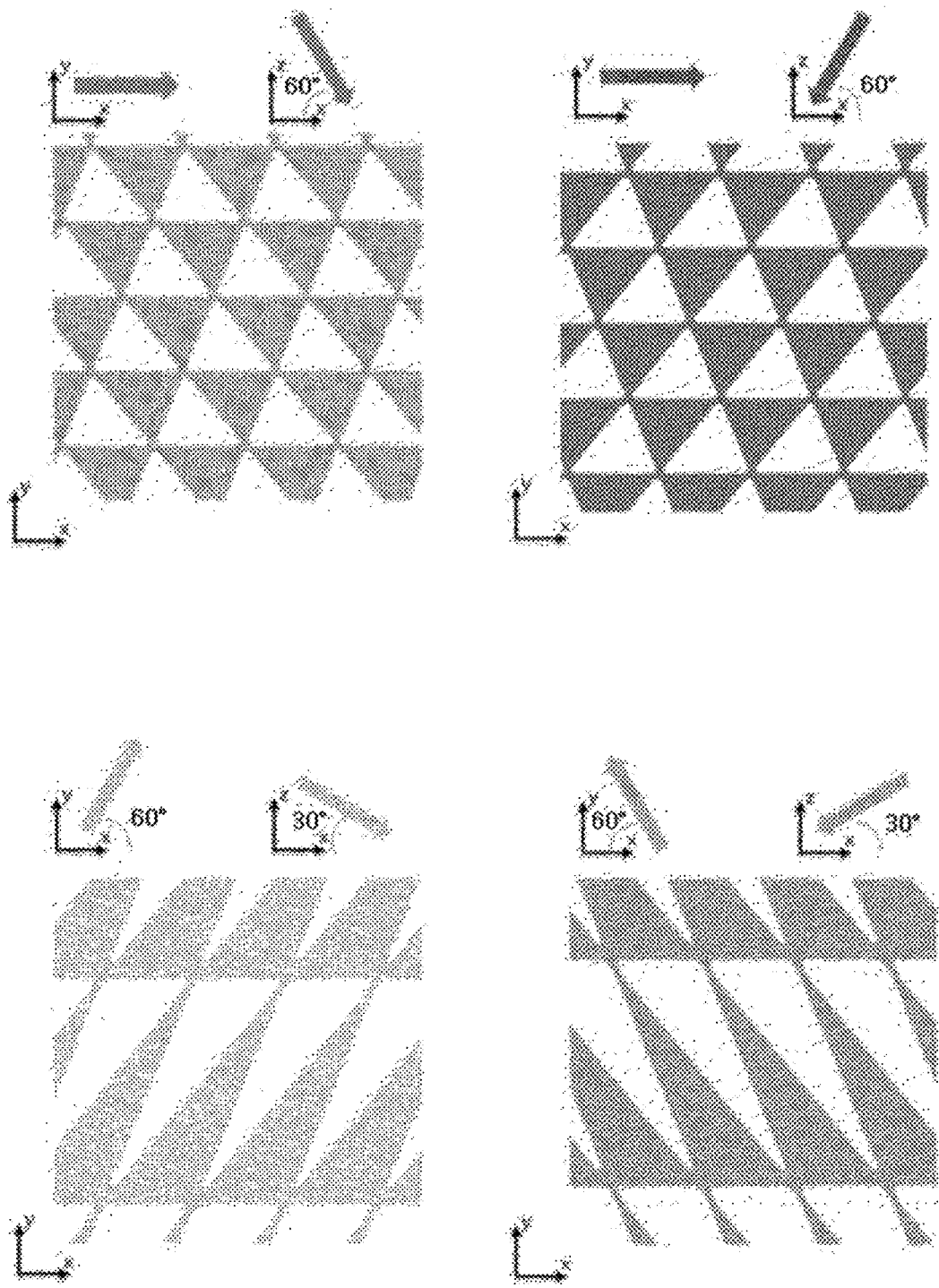
FIGS. 13 to 24 illustrate examples of masks and ultraviolet radiation directions used for fabricating ultra-low density three-dimensional thin film structure according to embodiments of the present invention.
Figure 25:
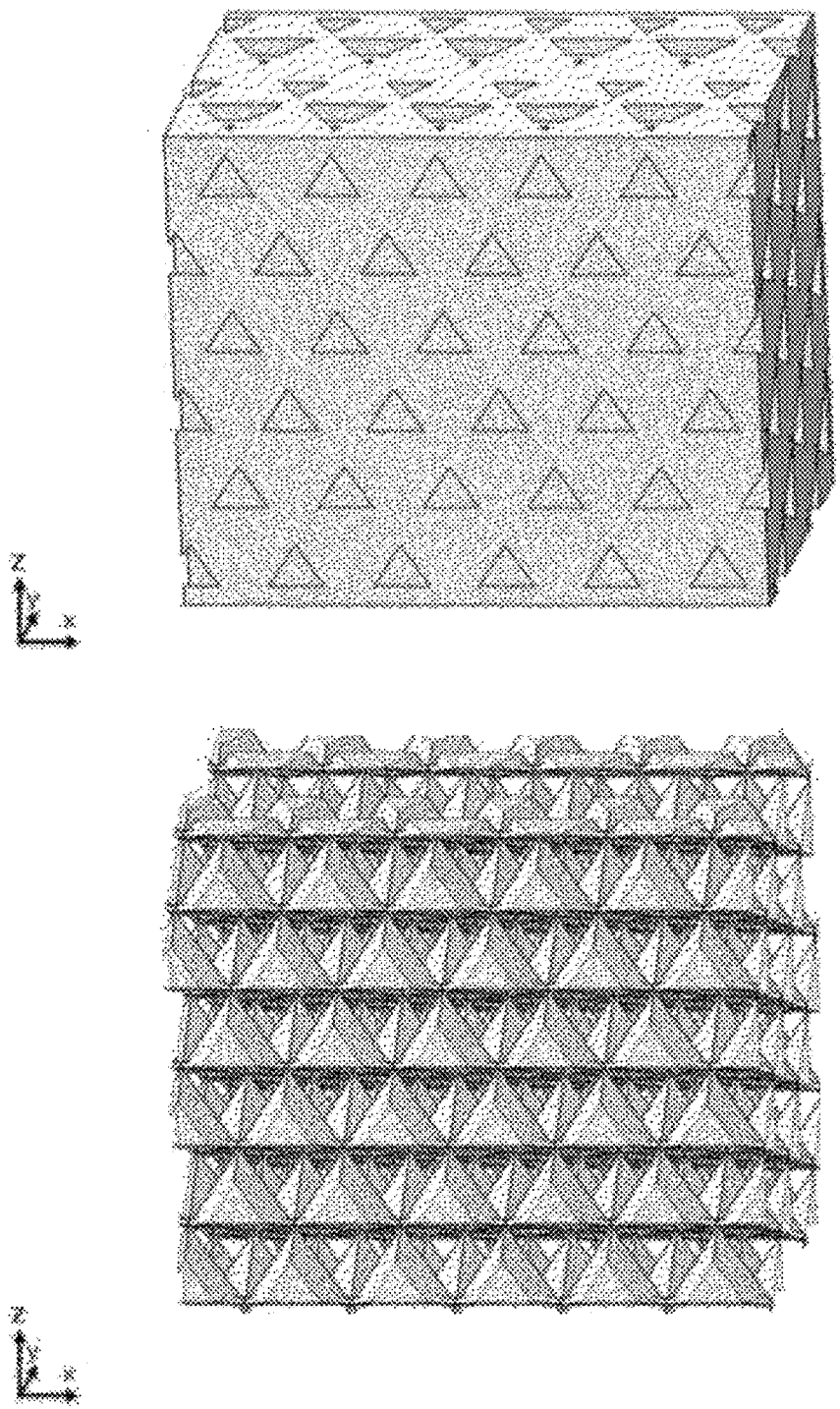
FIGS. 25 to 34 illustrate structure of ultra-low density three-dimensional thin film structure according to an embodiment of the present invention, fabricated according to FIGS. 13 to 24.

For example, referring to FIG. 13 illustrating an embodiment of the present disclosure, there are total two types of masks that are used, and a separate direction of the ultraviolet beam is selected with respect to each of the masks of the photosensitive resin. Specifically, when it is assumed that the upper surface of the liquid photosensitive resin bulk 100 is X-Y plane, in arranging the masks, both of the two types of masks are arranged in close contact with the upper surface of the liquid photosensitive resin bulk 100 in parallel. However, ultraviolet radiation varies depending on the directions respectively set for the respective masks. In a spatial aspect, the direction of radiating ultraviolet beams is determined based on the vector sum of the vector of radiation direction on x-y plane, with the vector of ultraviolet direction on x-z plane. FIG. 25 is a structural diagram of the thin film structure according to FIG. 13.

Figure 14:
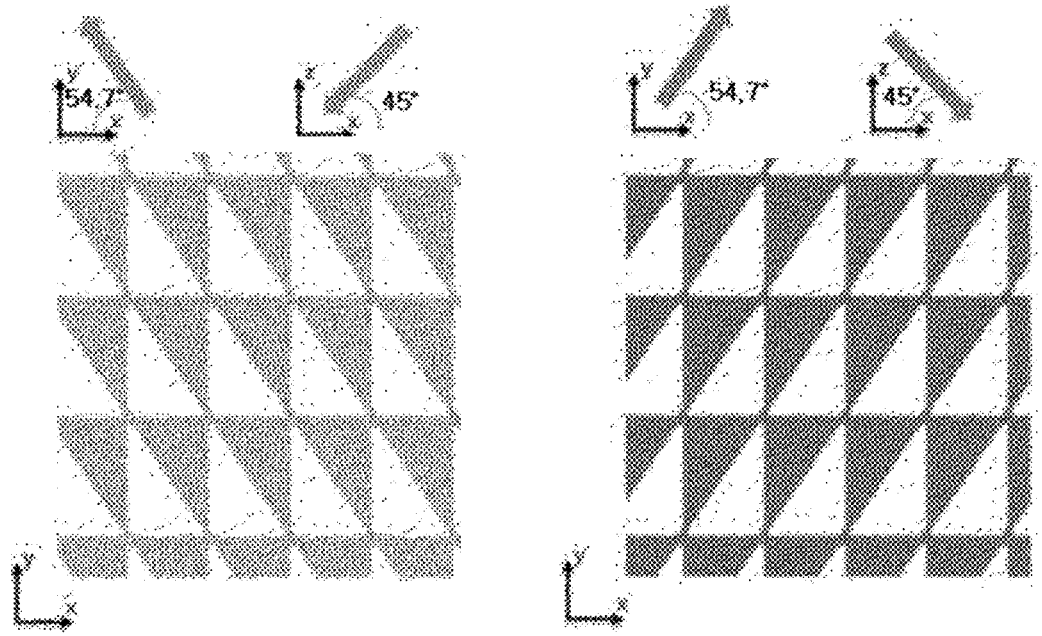
Figure 14:
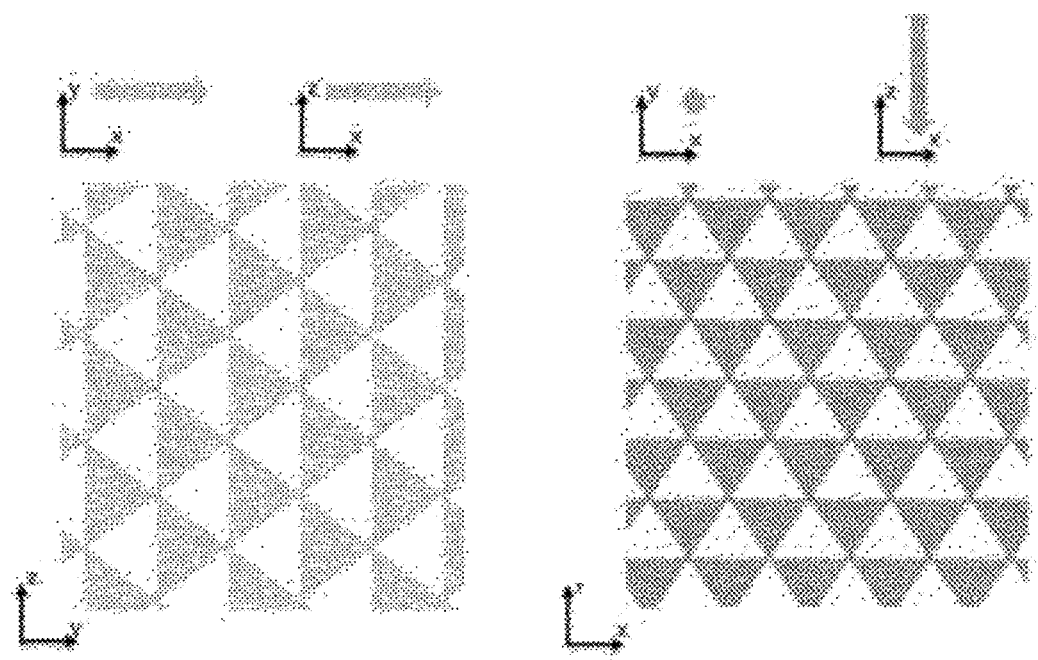
Figure 26:
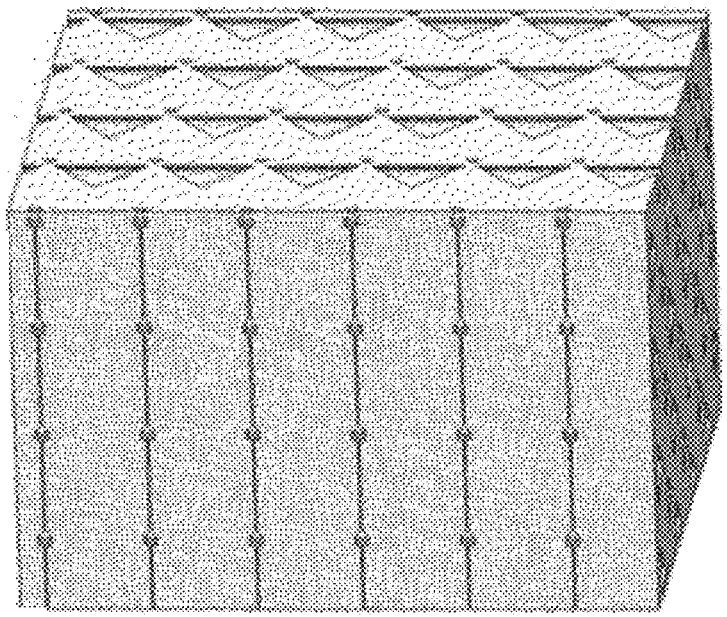
Figure 26:
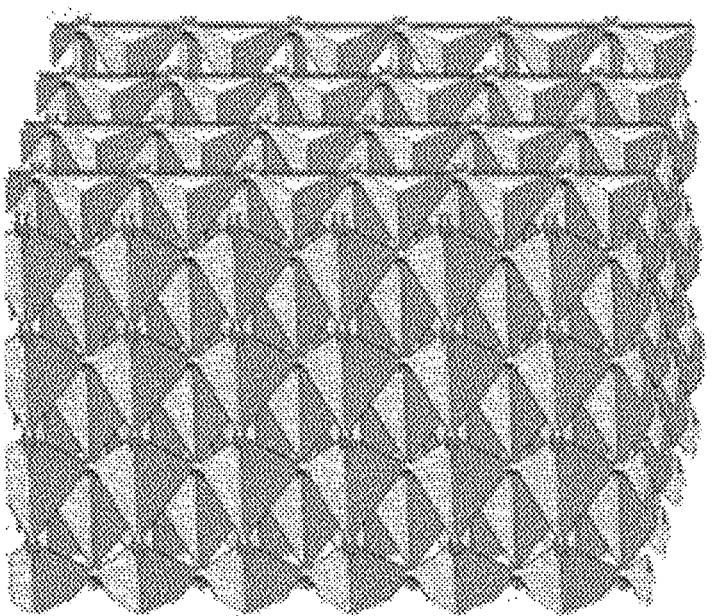

Meanwhile, the thin film structure according to FIG. 26 in the identical structure as that of FIG. 25 may be fabricated by the masks, shapes of arrangement, and directions of ultraviolet radiation according to another embodiment illustrated in FIG. 14. There are total three types of masks used in FIG. 14, and like the embodiment of FIG. 13, the direction of ultraviolet radiation with respect to each of the masks is determined separately, except that in FIG. 14, the mask arrangement is based on two planes, i.e., on x-y plane and y-z plane, which is different from one plane of FIG. 13.

Referring back to FIG. 10 illustrating an embodiment of the present disclosure, the present disclosure is characterized by the masks respectively having a pattern of predetermined polyhedrons bored in the vicinity of and alternately with each other. Due to the polyhedron shape of the mask pattern, the elements of the solid photosensitive resin structure 104 have a shape of prism. As will be described below, the solid photosensitive resin structure 104 functions as a mold to form the thin film structure (i.e., final result) of the present disclosure, and the prism shape of the solid photosensitive resin structure 104 causes the surface of the unit cell 300 of the thin film structure to have flat surface elements. These flat surface elements of the unit cell 300 of the thin film structure increase structural strength of the structure itself, and also enhance specific surface area, thus allowing the thin film structure to be advantageously utilized as a heat transmission medium or as a catalytic support.

Meanwhile, because the masks used in the conventional micro-lattice fabrication are formed such that the fine hole pattern is at a wider interval than the aperture of the hole itself, it is impossible to ensure sufficient penetration distance because the ultraviolet beam aperture radiated onto the photosensitive resin is also small. Accordingly, it is difficult to form the conventional large-sized micro lattice. Regarding this, the present invention can provide large-sized structure, as it is possible to ensure sufficient distance of penetration with respect to the photosensitive resin due to relatively larger aperture of the mask holes.

Further, compared to the conventional micro-lattice fabricated by photo-lithography, in which a single type of mask having micro-hole pattern processed therein is used by radiating ultraviolet rays from a plurality of directions, so that a plurality of slender and long ultraviolet beams form regular truss forms of solid photosensitive resin structure while intersecting with each other in three-dimensional space, the present invention uses one or more masks and radiate ultraviolet beams in respectively designated directions, thus allowing the prism forms of ultraviolet beams to intersect with each other in the three-dimensional space, forming solid photosensitive resin structures in a regular arrangement of polyhedrons.

Referring to FIG. 10, a thin film is formed on the entire surface of the solid photosensitive resin structure 104 from which the liquid photosensitive resin 102 has been removed. The thin film may be formed by plating for metal thin film, e.g., general electroplating or electroless plating, and by chemical vapor deposition (CVD), physical vapor deposition (PVD), atomic layer deposition (ALD) in the case of metal and ceramics, or polymer thin film. Regarding electroless plating, it is a type of chemical reduction plating to which autocatalytic plating can be easily applied. In this case, not all the empty spaces 200, from which the liquid photosensitive resin 102 is removed, are filled up, as the solid thin film is formed only on the surface of the solid photosensitive resin structure 104, while the empty spaces 104 define interior spaces of the unit cells 300 of such constructed thin-film structure.

As described above, the solid photosensitive resin structure 104 functions as a mold for the unit cells 300 constructing the thin film structure, and have to be removed in order to form final form of the thin film structure having unit cells 300. The process of removing the solid photosensitive resin structure 104 may be performed by removing the thin film formed on an area corresponding to the outermost surface of the initial form of resin bulk among the surface of the solid photosensitive resin structure 104, thus exposing this to outside the solid photosensitive resin structure 104, and then finally removing the solid photosensitive resin structure 104 through the exposed portions.

First, the thin film formed on the outermost surface of the resin bulk may be performed by mechanic polishing or chemical etching, or electrolytic polishing, although the mechanic polishing is advantageous considering selective control aspect. In order to selectively remove only the thin film on the outermost surface of the resin bulk with chemical etching or electrolytic polishing, it is necessary to seal off the penetrated portions using material such as paraffin to ensure that there is no ingress of etchant or electrolyte into the structure.

Figure 11:
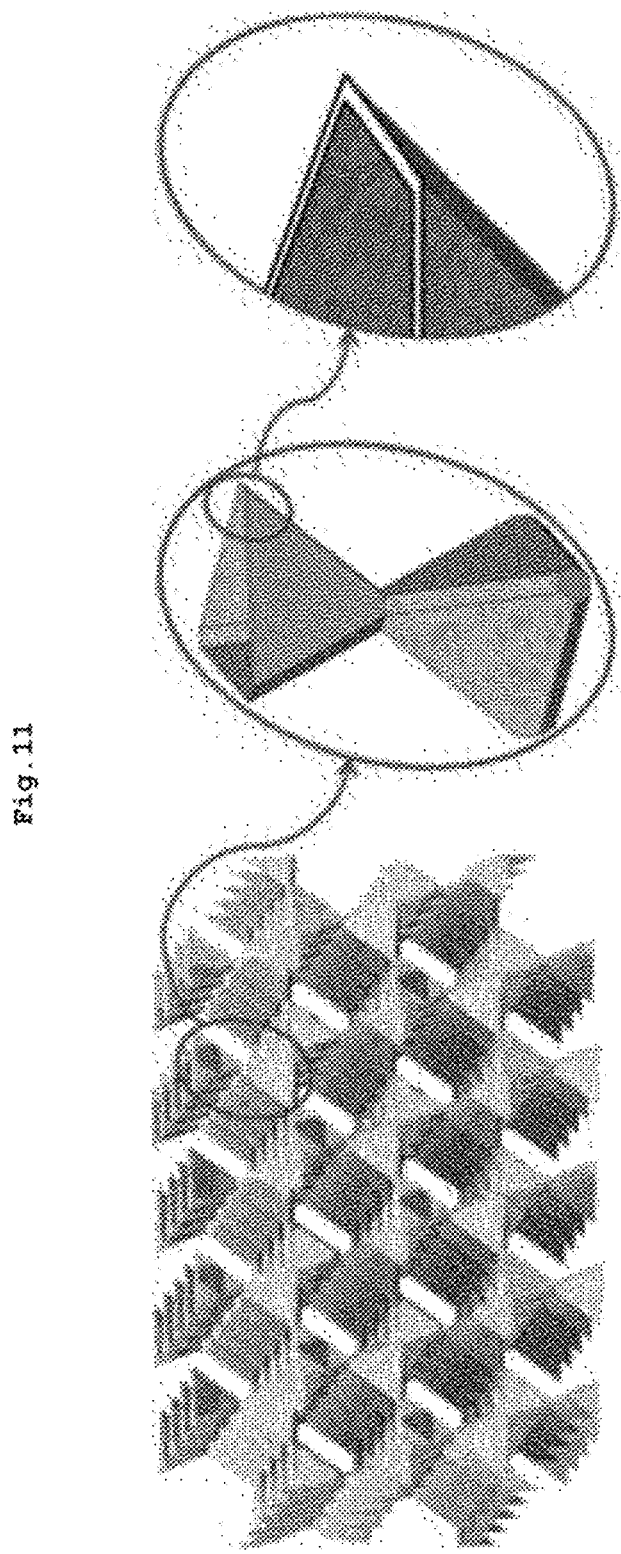
FIG. 11 illustrates a structure of a thin film structure having engraved Kagome unit cells according to an embodiment of the present invention.
Figure 12:
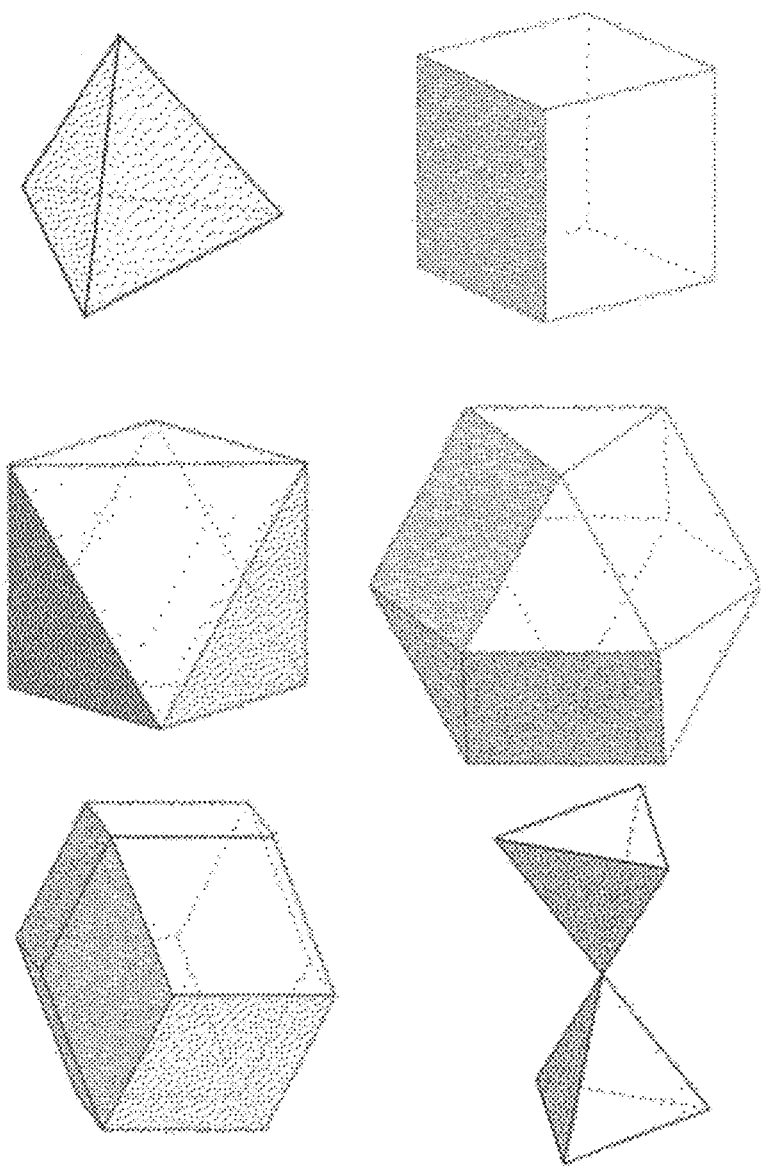
FIG. 12 illustrates a structure of unit cells according to Table 1.

Next, by removing the solid photosensitive resin structure 104 whose surface is partially exposed by generally known chemical, physical, biological, thermal or optical methods, the final form of unit cells 300, ultra-low density three-dimensional thin film structure is formed, as illustrated in FIG. 11.

Referring to FIG. 11, the unit cells 300 are in polyhedron structure having hollow portion therein, within thin film (several hundred nanometer) serving as the wall elements. The respective unit cells 300 are interconnected with each other and formed repeatedly in the space.

Meanwhile, according to one of the characteristics of the present invention, unlike the conventional micro-lattice, the three-dimensional thin film structure consisting of unit cells are formed in 'engrave' manner with respect to the solid photosensitive resin structure which serves as the mold. Specifically, contrary to the conventional micro-lattice in which the final truss structure consisting of thin films that takes on a geometrical shape identical to the lattice formed of solid photosensitive resin, the thin film structure according to the present invention takes on a geometrical shape that is opposite to the solid photosensitive resin structure. When the thin film structure is formed by this 'engrave' manner, unlike the conventional micro-lattice, there is an advantage that discontinuous structure can be formed. Further, because the number of ultraviolet radiation decreases and the resin, which is in a form of solidified pillars within the engraving, has a large surface area, speed of etching is increased when the corresponding solid photosensitive resin is removed by etching method.

Further, according to another characteristic of the present invention, it is possible that the lattice element of the thin film structure is formed out-of-plane, even when the ultraviolet rays are radiated with the mask is arranged on one side of a specific plane of the liquid photosensitive resin bulk 100. That is, as described above, when the thin film structure is formed in the 'engrave' manner, the solid photosensitive resin structure takes on a shape of a block, thus indicating that it is still possible to form the structure in z-axis even by arranging the mask on only one plane (e.g., x-y plane) and moving the mask on the plane and radiating ultraviolet rays several different directions.

As described, the method for fabricating thin film structure having a predetermined shaped of polyhedron cells may be characterized by three factors including: pattern and number of necessary masks; shapes of arrangement of the masks with respect to the photosensitive resin bulk (i.e., number of radiation planes with respect to the photosensitive resin bulk); and direction of ultraviolet radiation with respect to the respective masks. Table 1 below lists types of masks necessary for fabricating thin film structure having a predetermined polyhedron unit cells, number of radiation planes of the masks with respect to the photosensitive resin bulk, and direction of the ultraviolet radiation.

TABLE 1

| Polyhedron shape | 1-plane radiation | | 2-plane radiation | |
| --- | --- | --- | --- | --- |
| | 1 mask | 2 masks | 1 mask | 2 masks |
| Tetrahedron | | 2 + 2 | | 2 + 2 |
| Cube | 3 | 1 + 2 | 3 | 1 + 2 |
| Octahedron | 4 | | | 2 + 2 |
| Vector Equilibrium | | 1 + 4 | | 1 + 4 |
| Rhombic dodecahedron | | 1 + 2 | | 1 + 2 |
| Kagome | 4 | | | 1 + 3 |

In Table 1, the column "1 mask" indicates that the number of masks used is one, and the column "2 masks" indicates that the number of masks used is two. In the column "2 masks", the numbers before and after the symbol "+" indicates the number of cases regarding the direction of ultraviolet radiations with respect to the respective masks. For example, referring to FIG. 25, it is possible to form the structure having tetrahedron-shaped hollow unit cells by 1-plane radiation, by using the two types of masks illustrated in FIG. 13 and by using two directions of ultraviolet radiations with respect to the respective masks.

FIGS. 13 to 24 illustrate the specific shapes and types of the masks corresponding to respective cells of Table 1, shapes of arrangements of the respective masks with respect to the photosensitive resin bulk, and directions of ultraviolet radiations, and FIGS. 25 to 33 illustrate the structures of the resultant thin film structures. For convenience of explanation, Table 2 below lists corresponding drawing numbers in the respective cells.

TABLE 2

Figure 15:
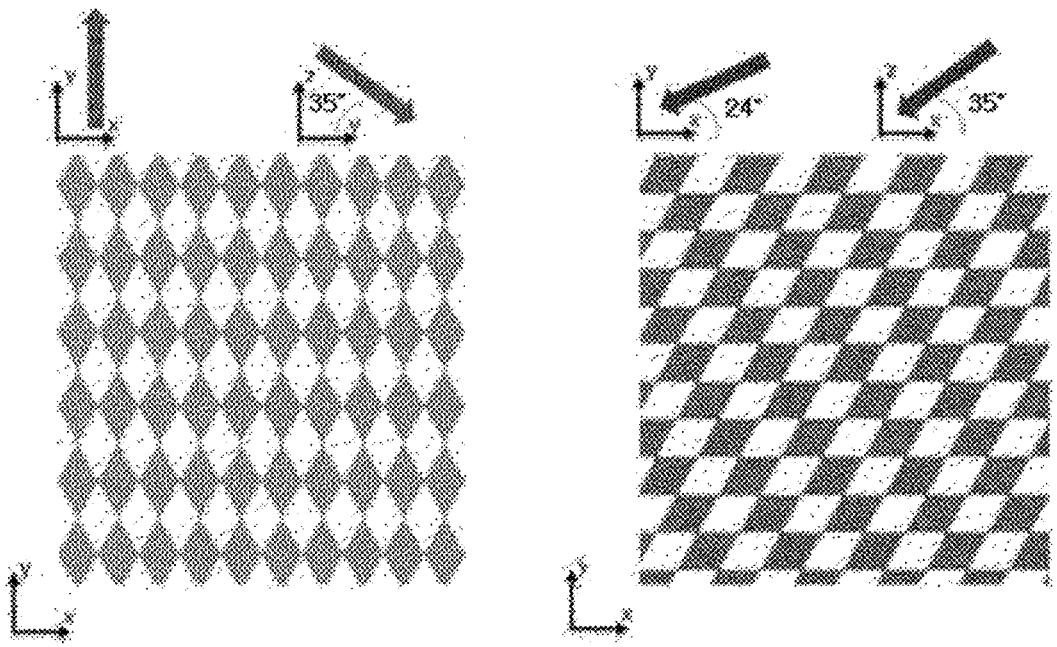
Figure 15:
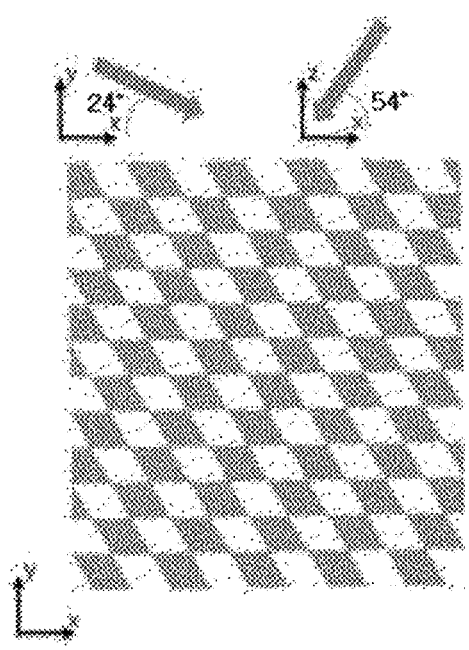
Figure 16:
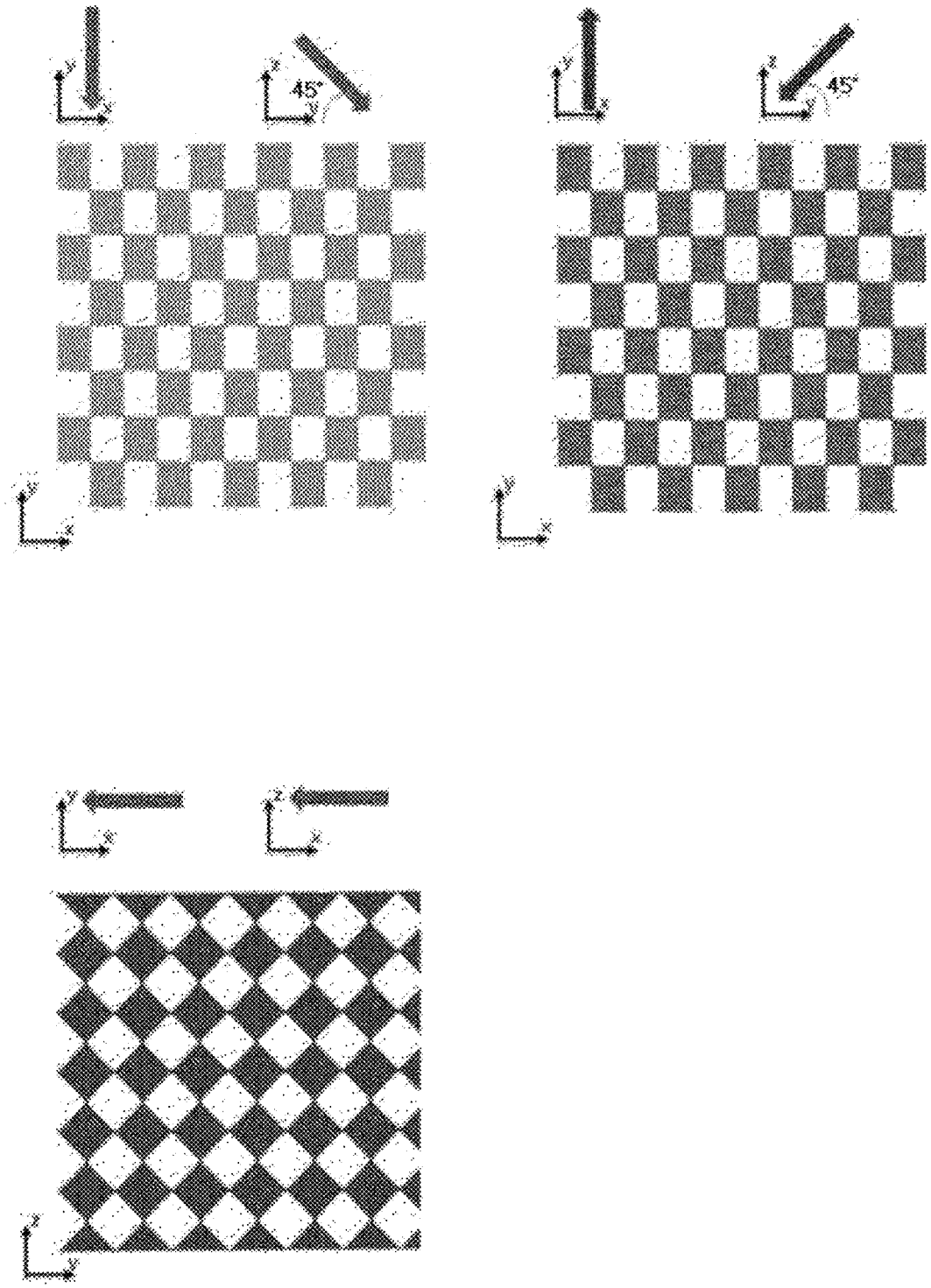
Figure 17:
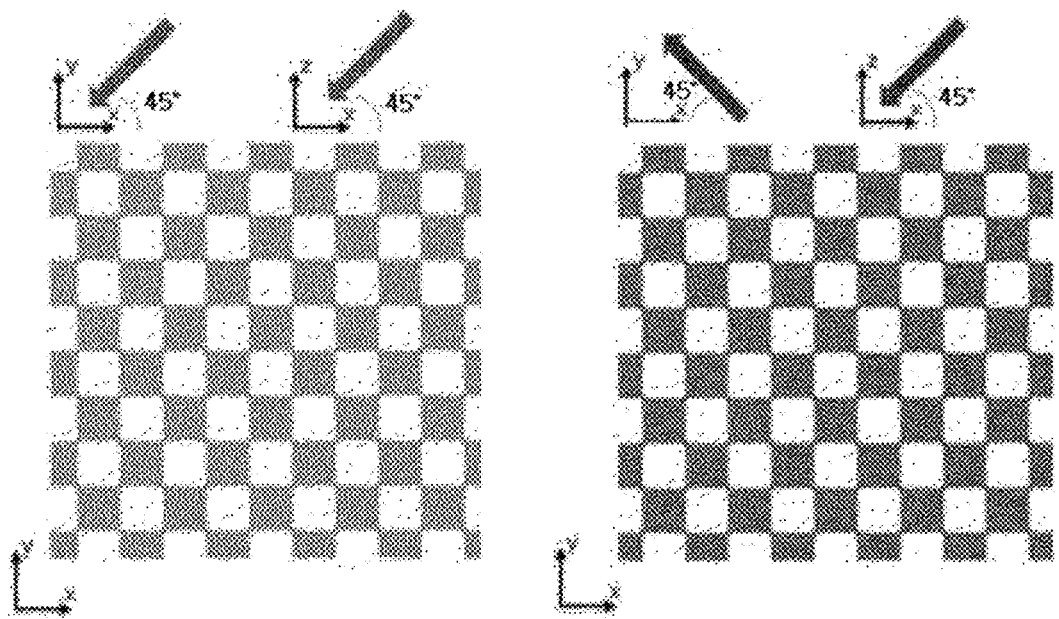
Figure 17:
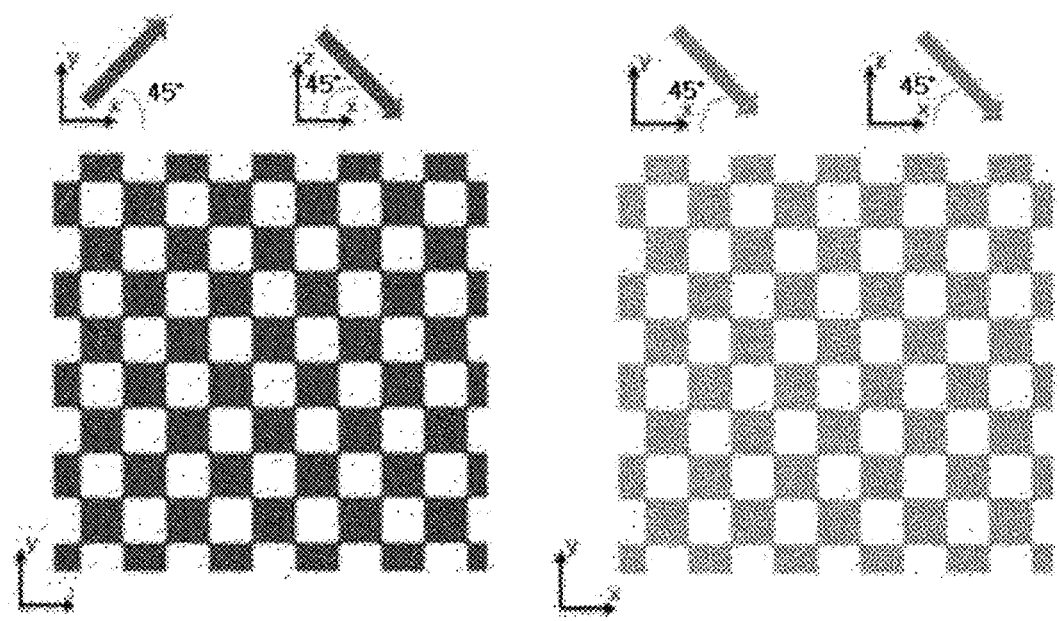
Figure 18:
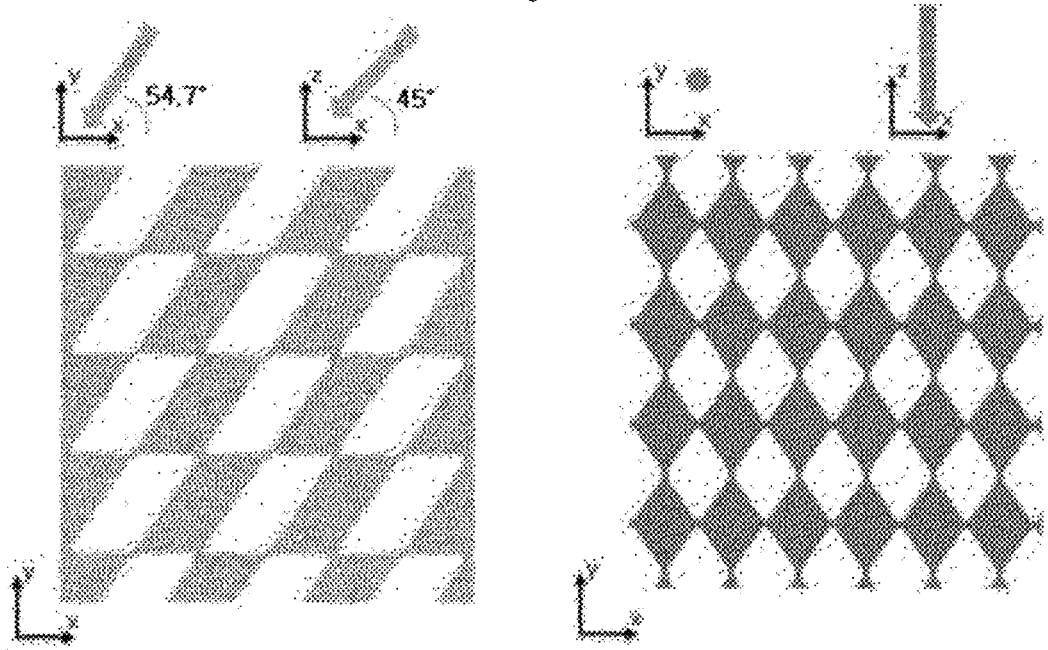
Figure 18:
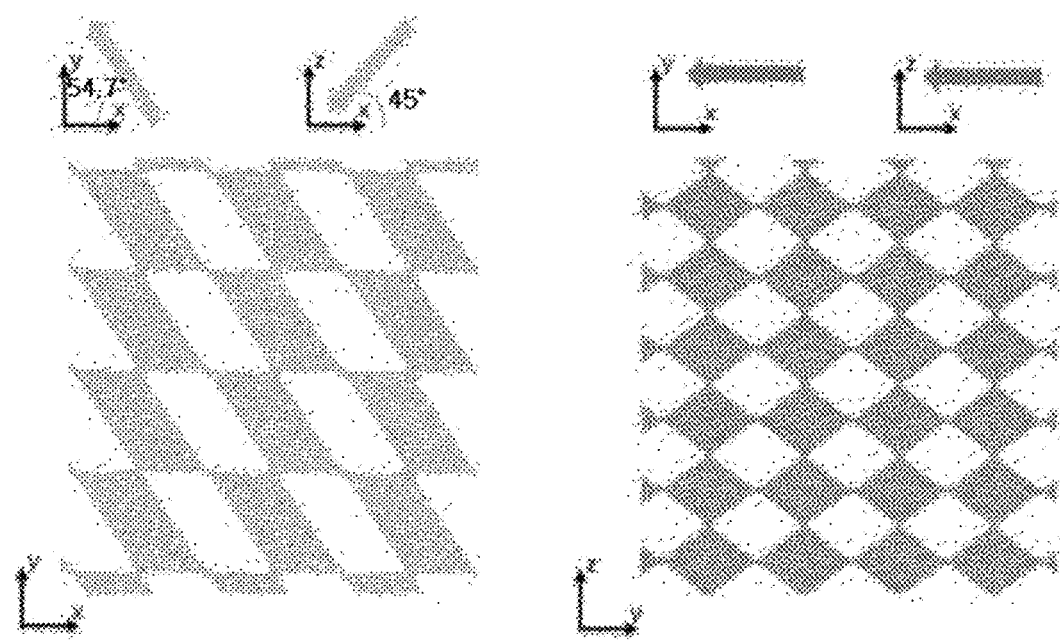
Figure 19:
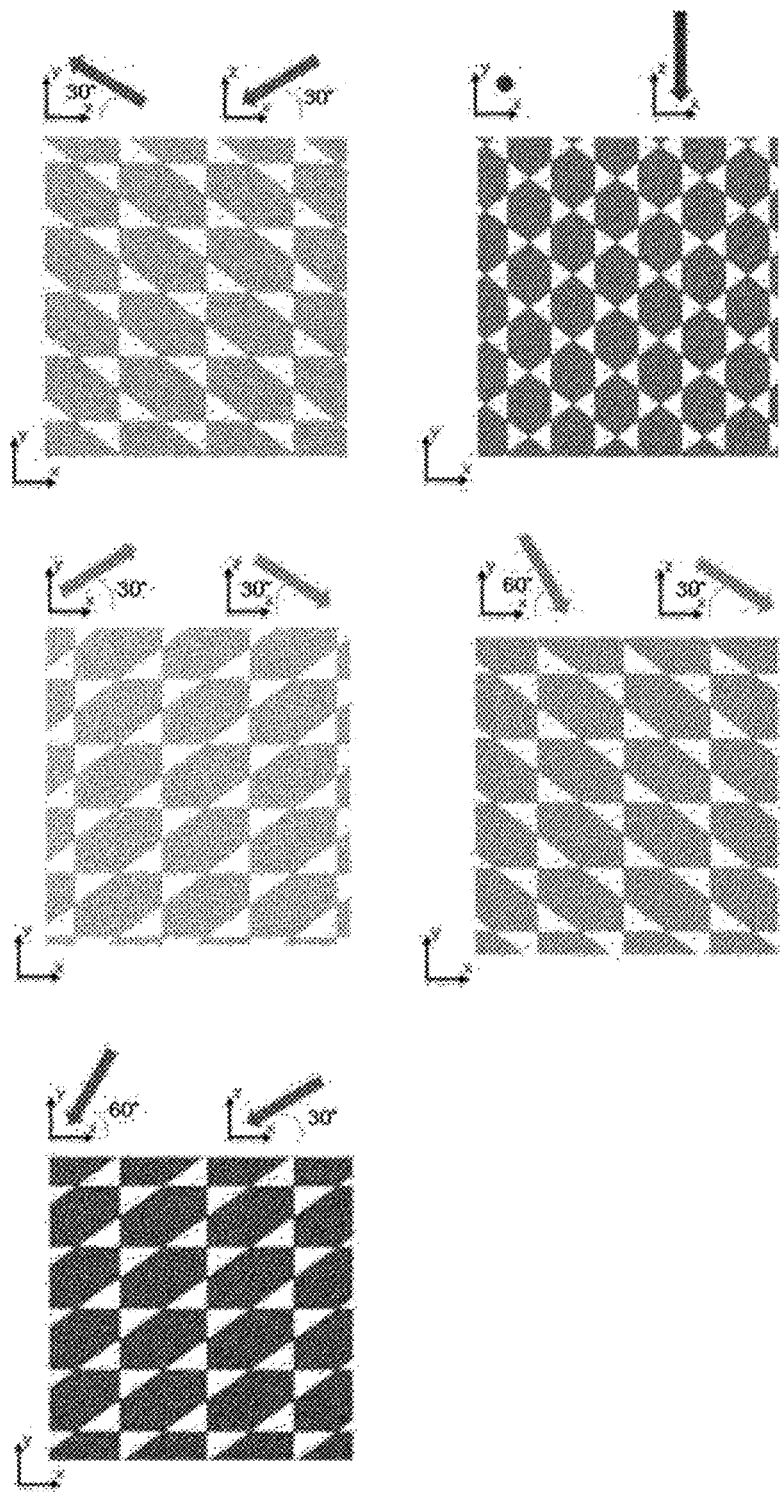
Figure 20:
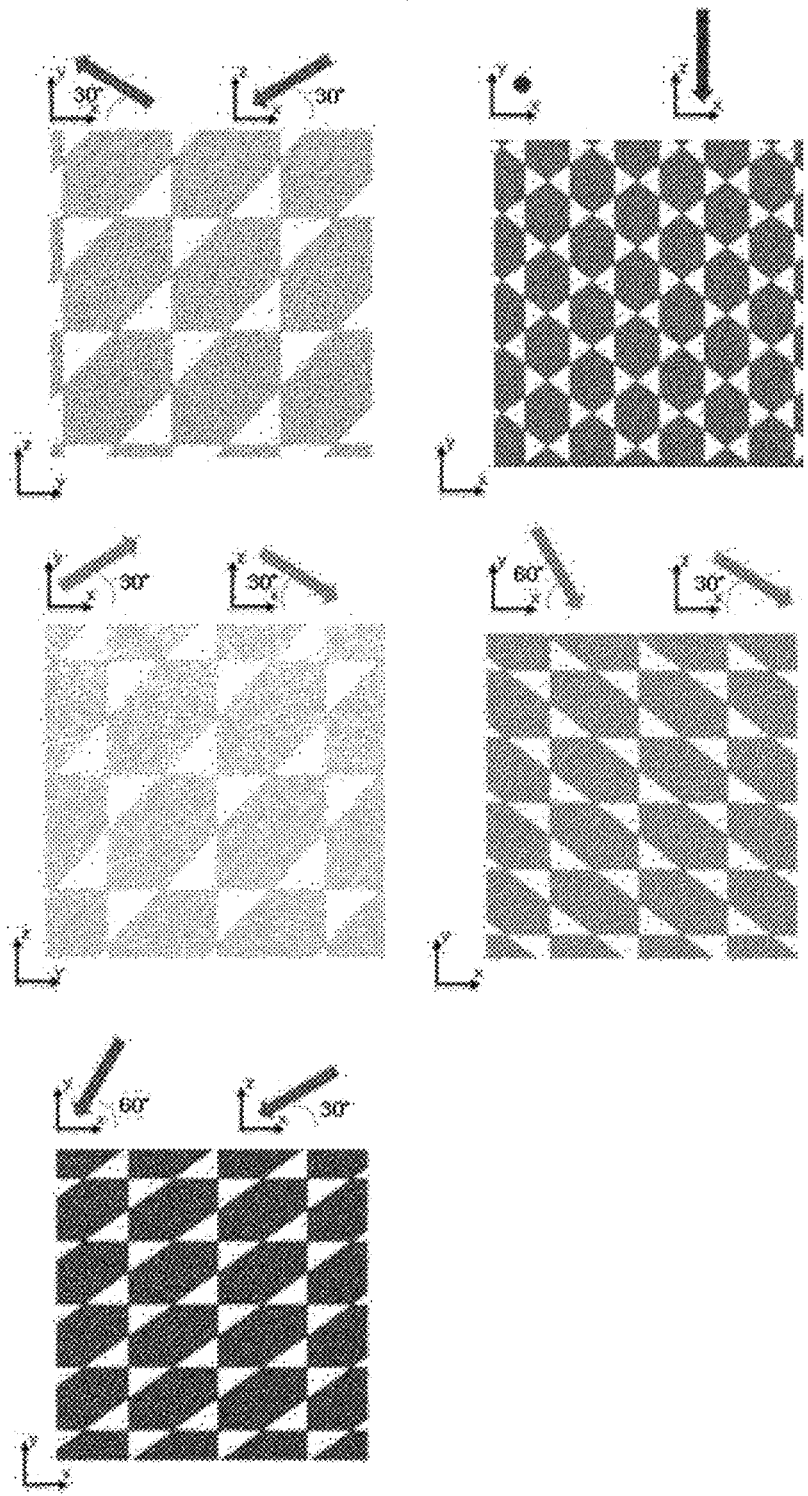
Figure 21:
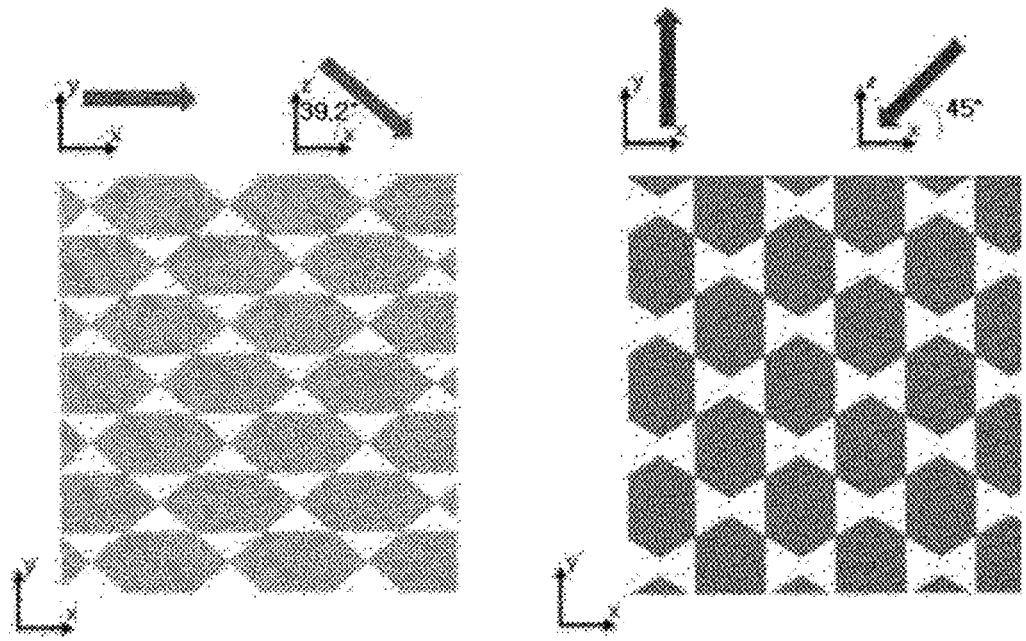
Figure 21:
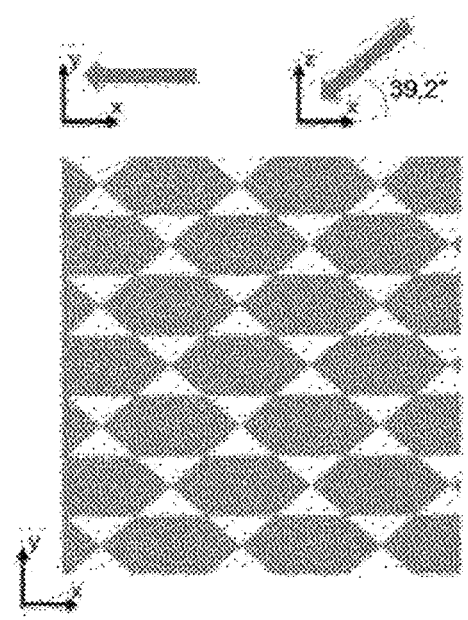
Figure 22:
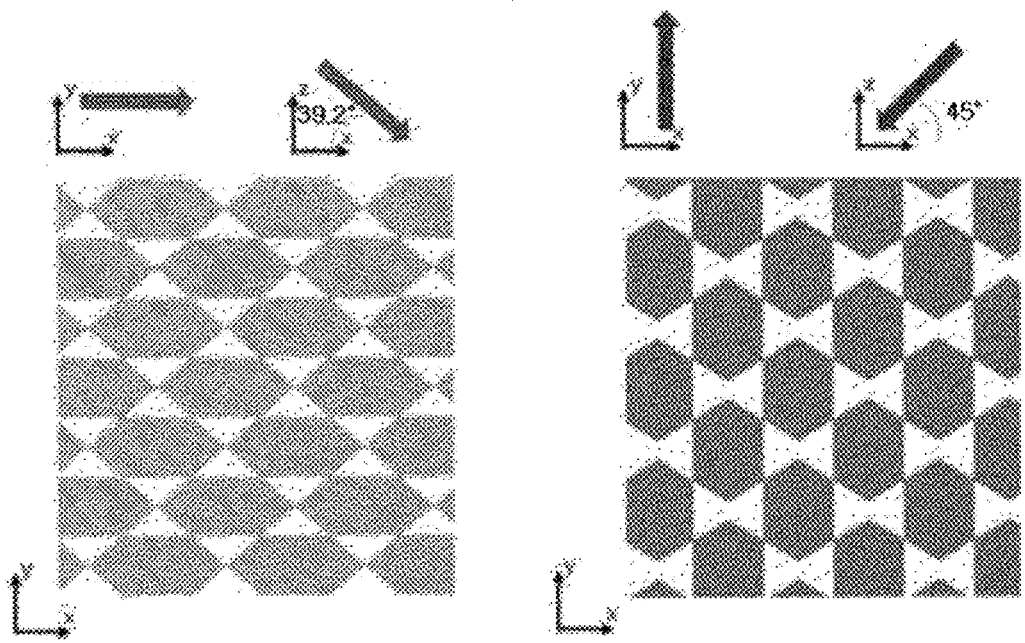
Figure 22:
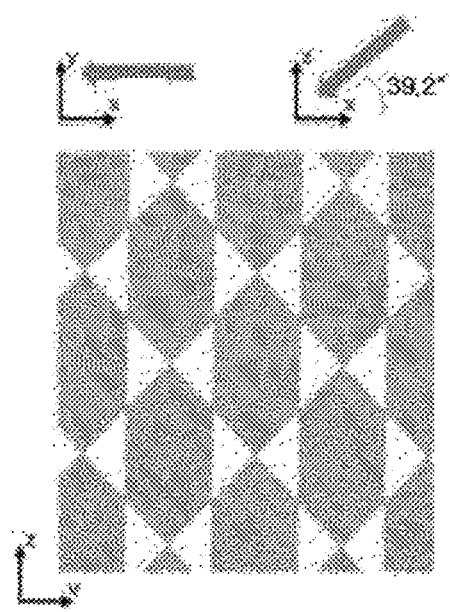
Figure 23:
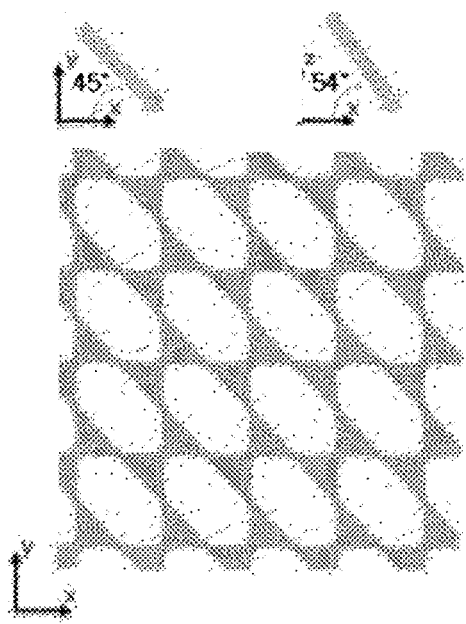
Figure 23:
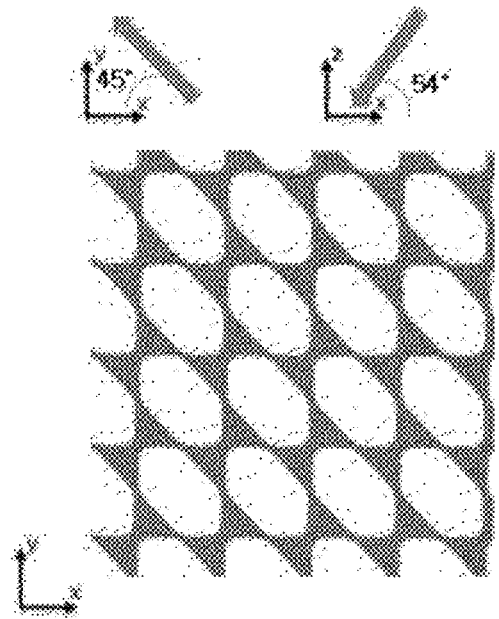
Figure 23:
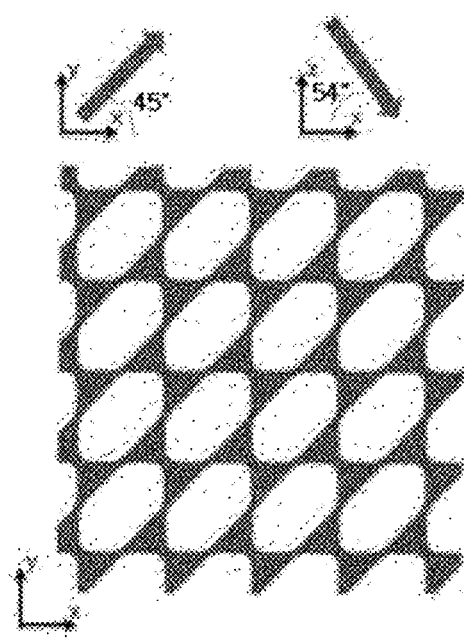
Figure 23:
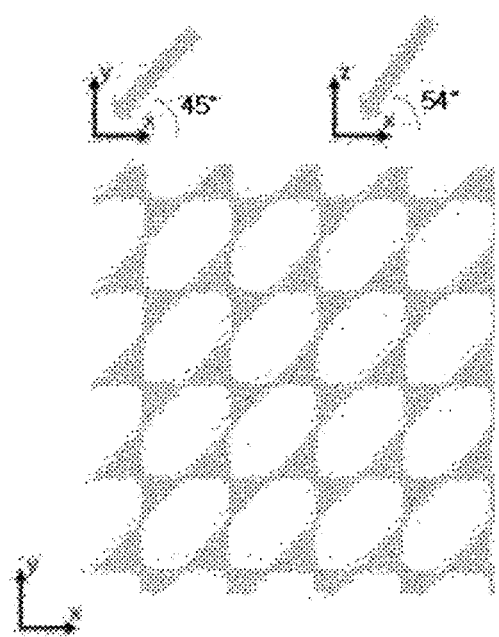
Figure 24:
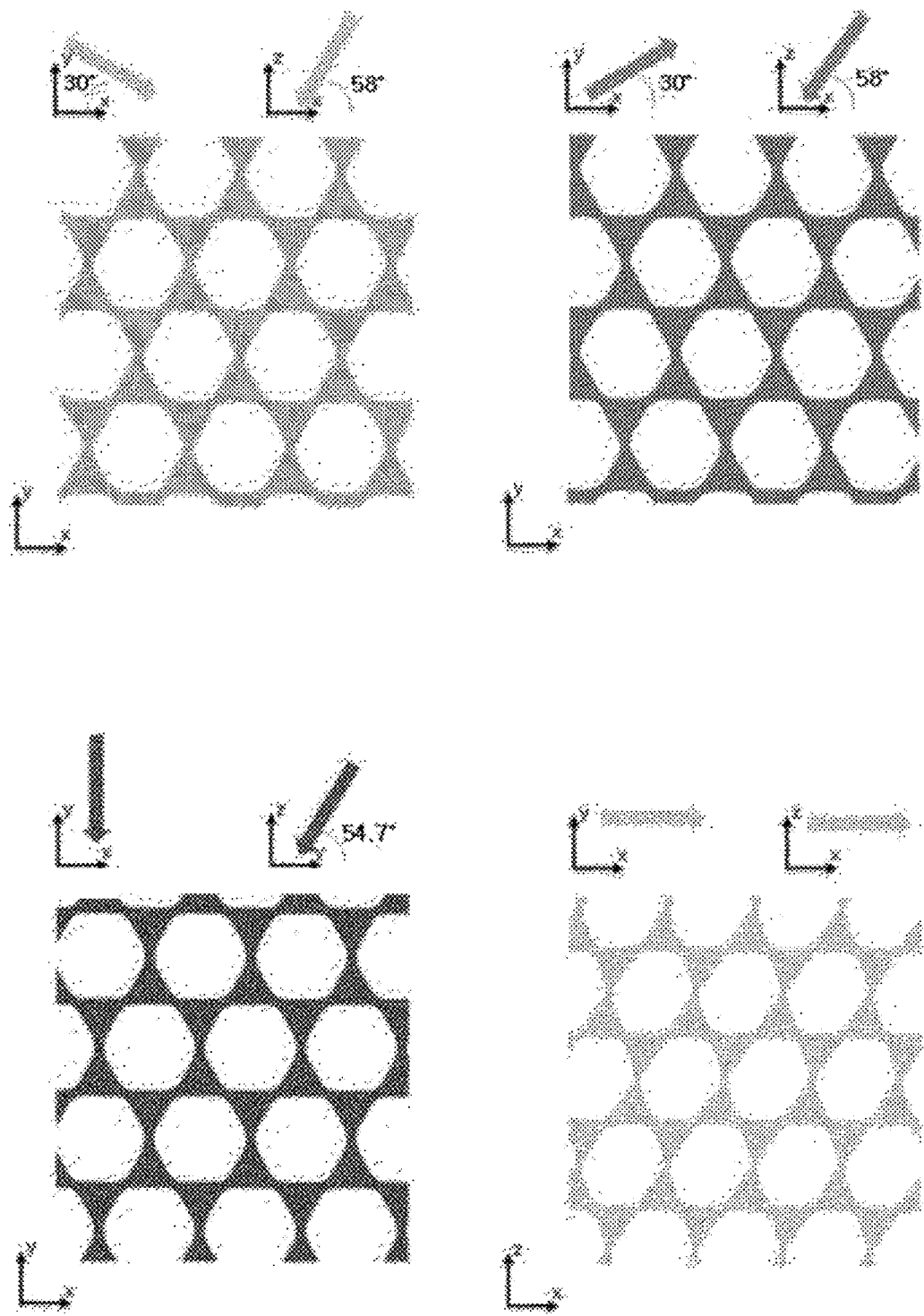
Figure 27:
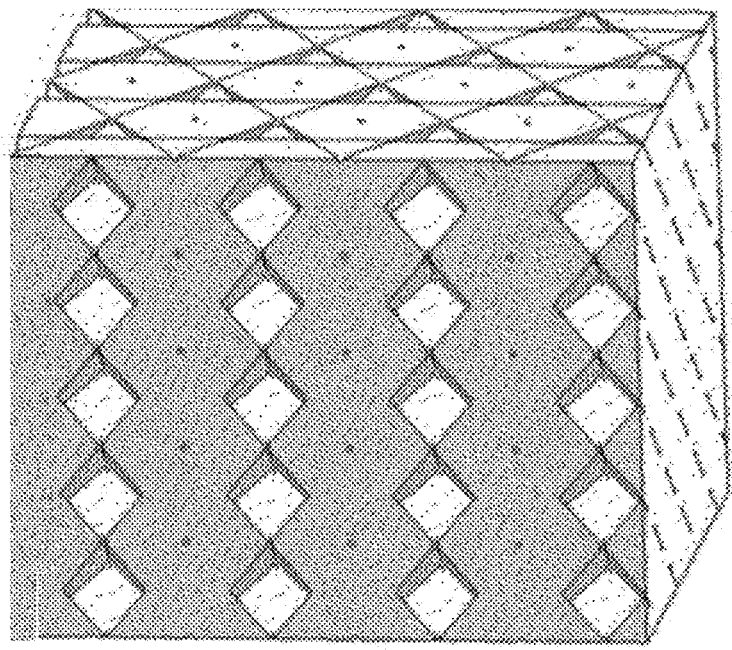
Figure 27:
Figure 27:
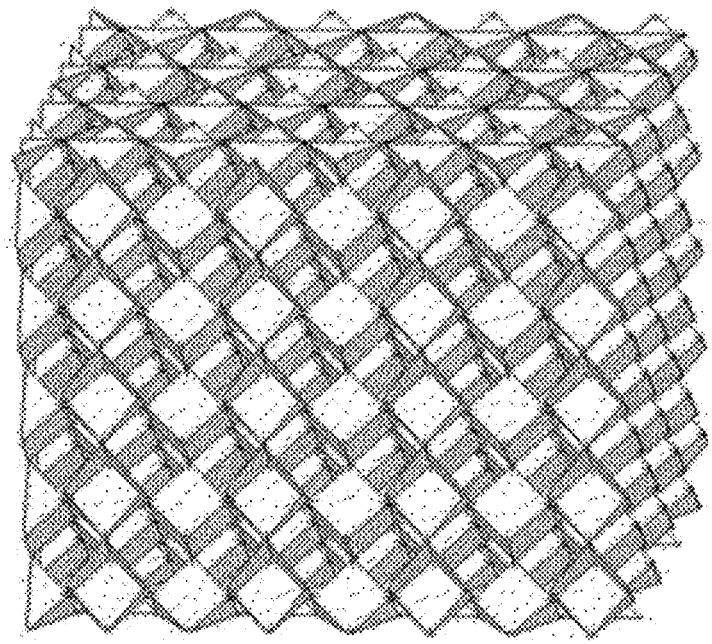
Figure 27:
Figure 28:
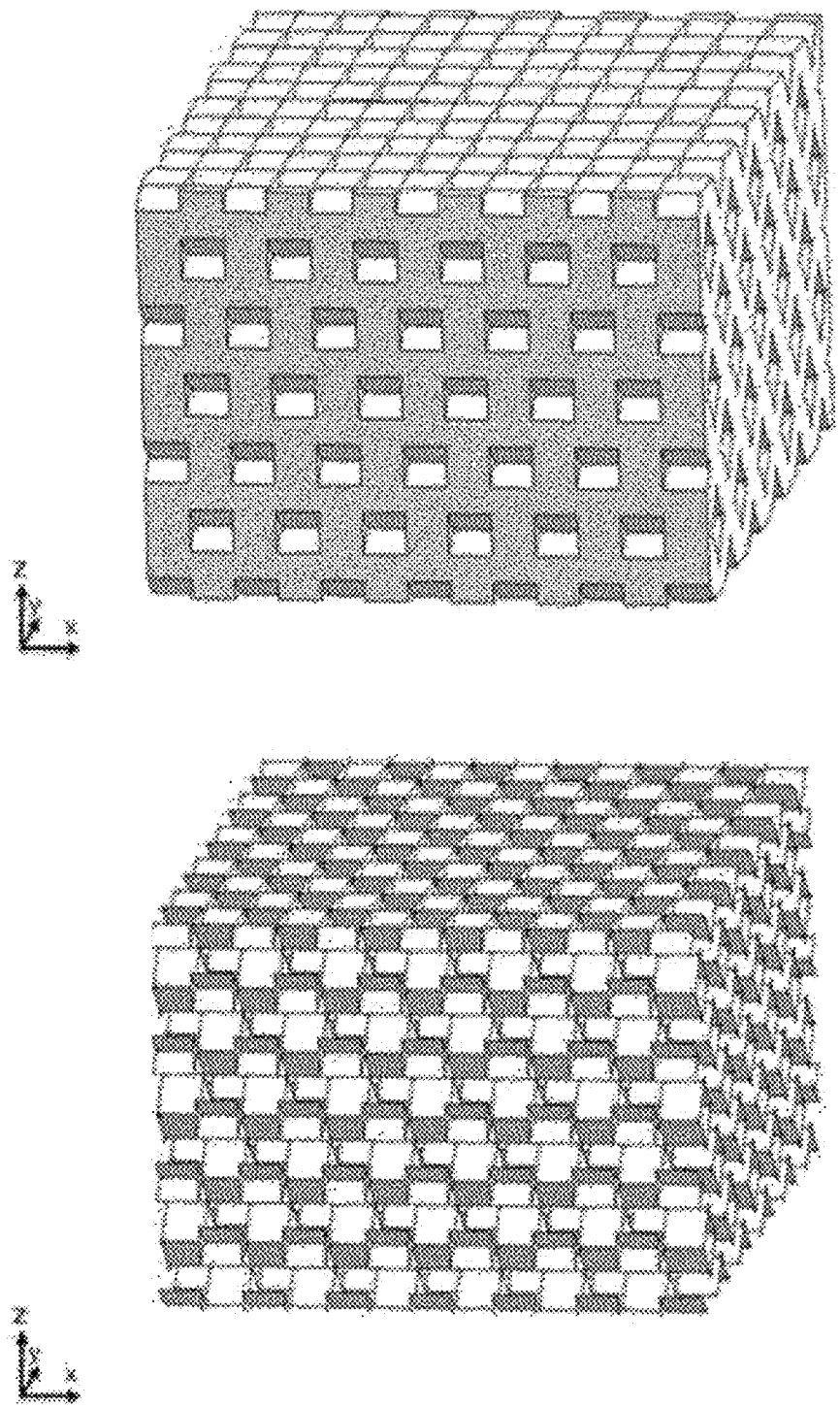
Figure 29:
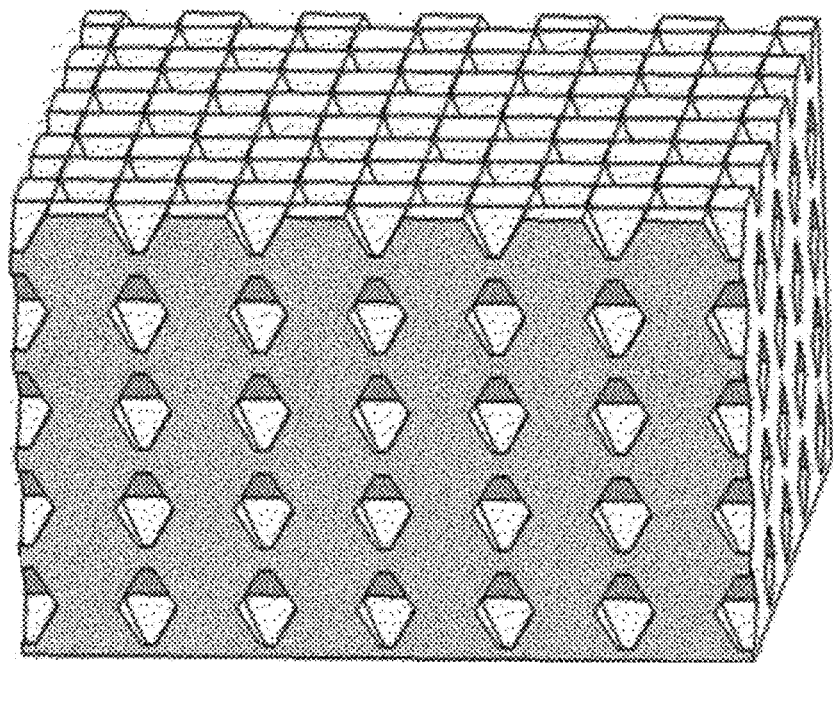
Figure 29:
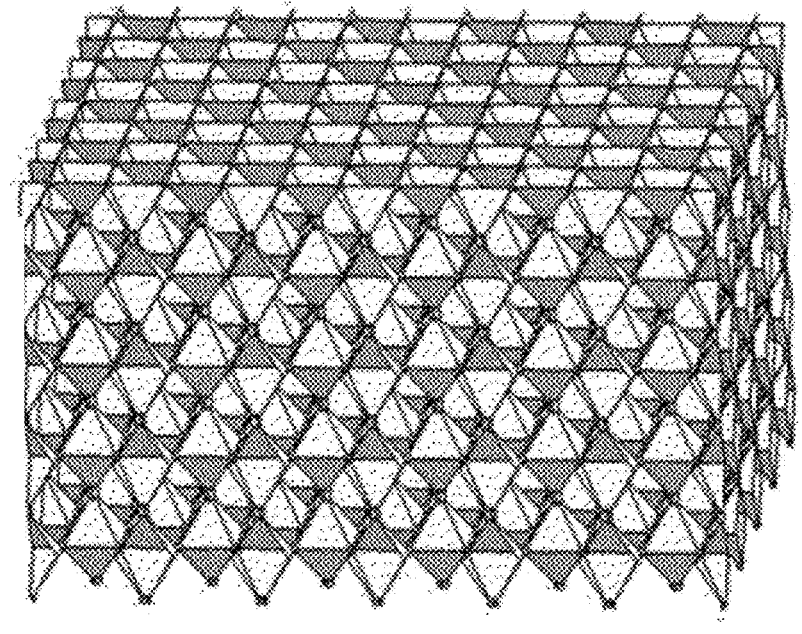
Figure 30:
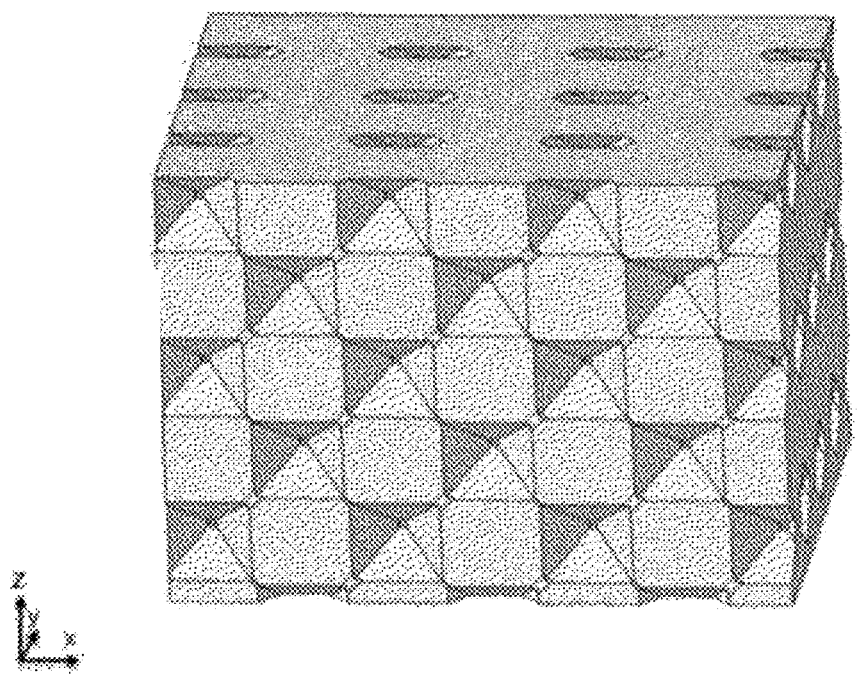
Figure 30:
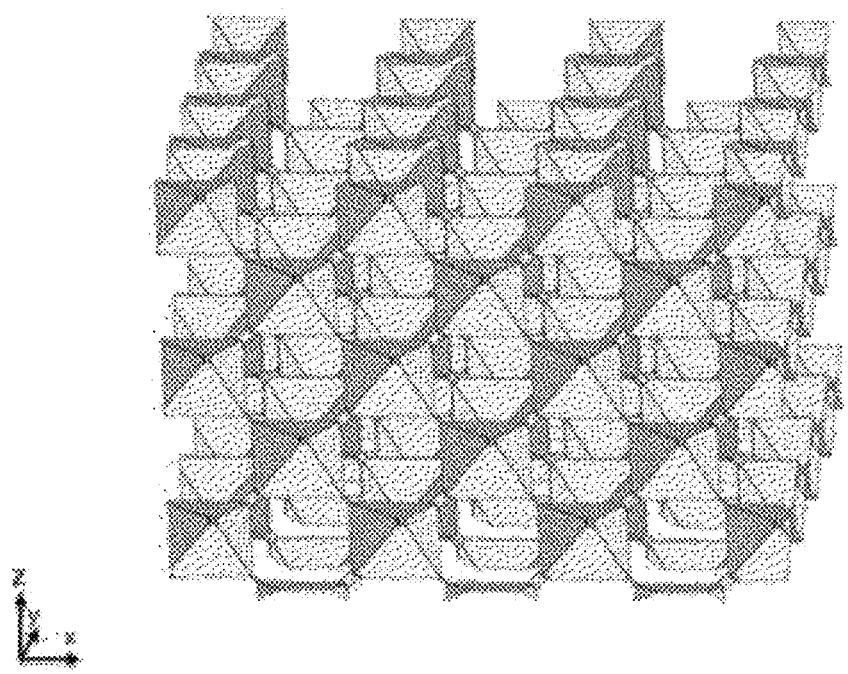
Figure 31:
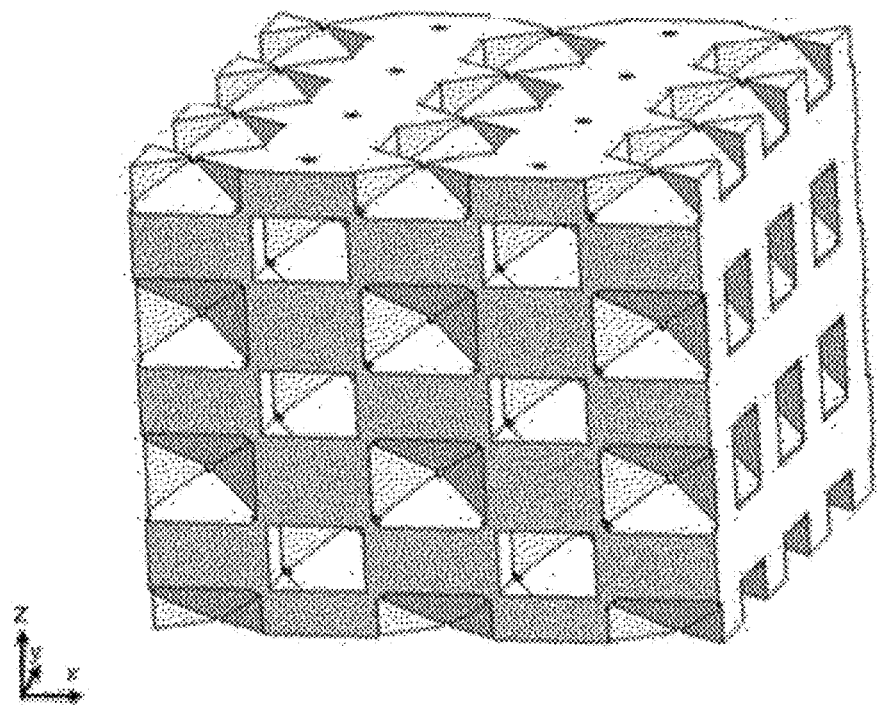
Figure 31:
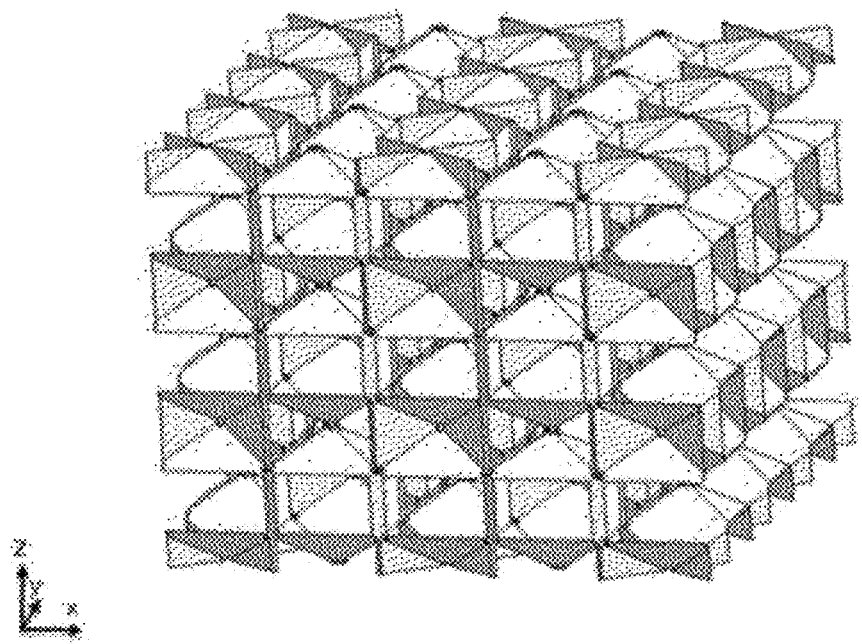
Figure 32:
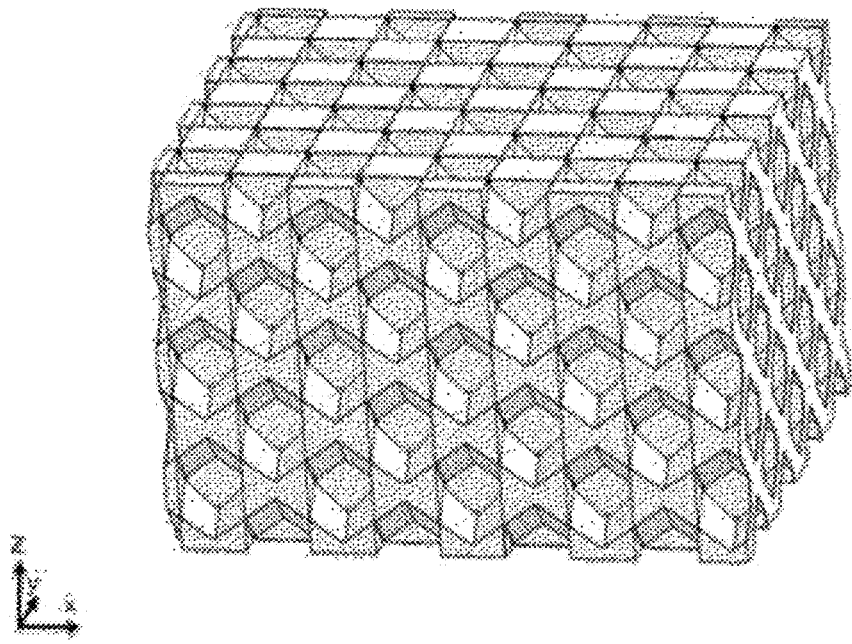
Figure 32:
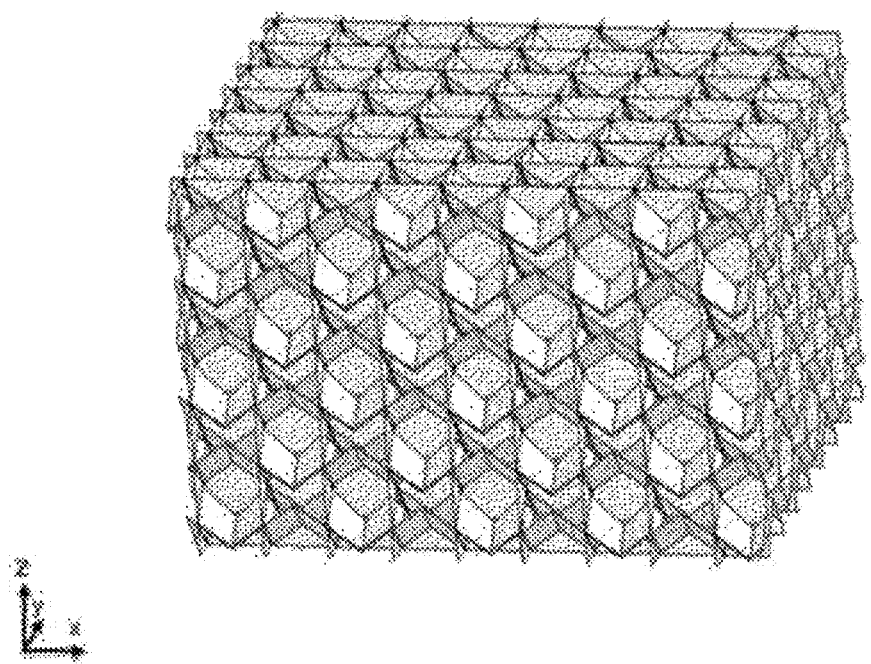
Figure 33:
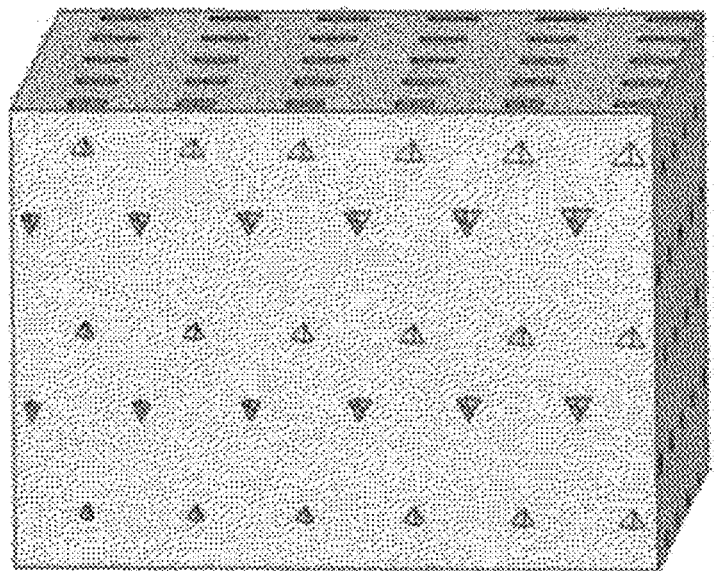
Figure 33:
Figure 33:
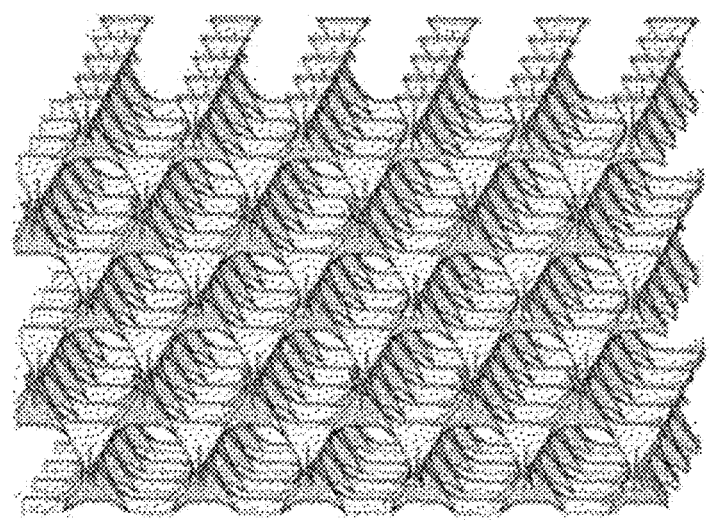
Figure 33:
Figure 34:
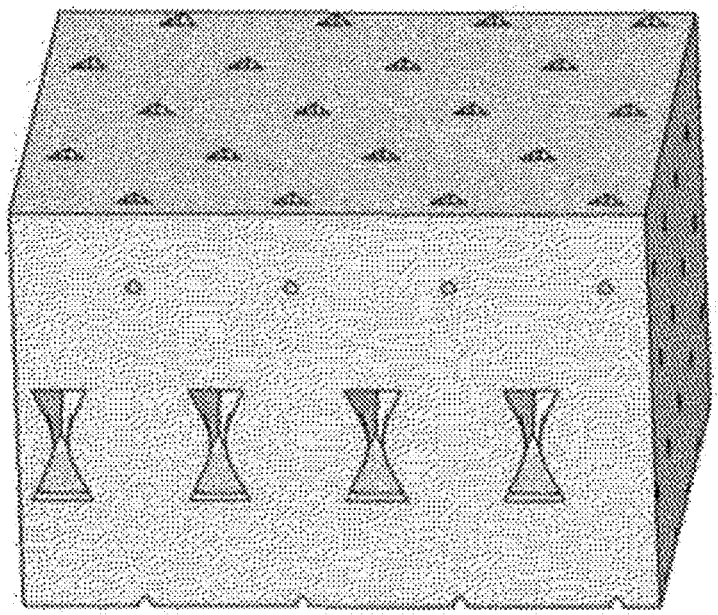
Figure 34:
Figure 34:
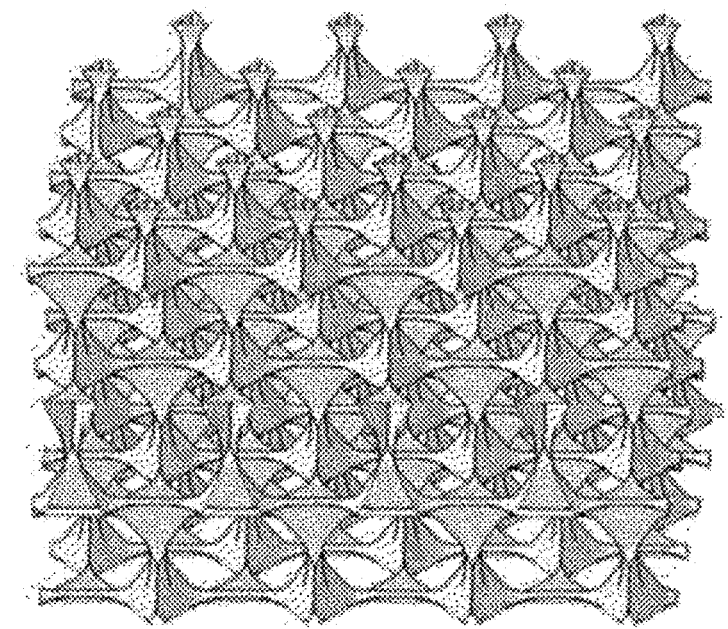
Figure 34:

| Polyhedron shape | 1-plane radiation | | 2-plane radiation | |
|---|---|---|---|---|
| | 1 mask | 2 masks | 1 mask | 2 masks |
| Tetrahedron | | FIG. 13/ FIG. 25 | | FIG. 14/ FIG. 26 |
| Cube | FIG. 15/ FIG. 27 | | FIG. 16/ FIG. 28 | |
| Octahedron | FIG. 17/ FIG. 29 | | FIG. 18/ FIG. 30 | |
| Vector Equilibrium | | FIG. 19/ FIG. 31 | | FIG. 20/ FIG. 31 |
| Rhombic dodecahedron | | FIG. 21/ FIG. 32 | | FIG. 22/ FIG. 32 |
| Kagome | | FIG. 23/ FIG. 33 | | FIG. 24/ FIG. 34 |

As indicated by Tables 1 and 2 and embodiments illustrated in FIGS. 12 to 34, even the same shaped thin film can be fabricated structure according to the present invention by varying the pattern and number of masks, shapes of arrangements of the masks with respect to the photosensitive resin bulk (i.e., number of radiation planes with respect to the photosensitive resin bulk), and directions of ultraviolet radiations with respect to the respective masks. However, it is to be noted that in view of practical concern, the masks may preferably be arranged on the largest bulk one plane (x-y plane) only, considering that the photo-lithography technique allows limited depth of ultraviolet penetration and that it would be necessary to put the resin in a container having greater width and length (x, y axis directions) compared to the depth (z axis direction) for the purpose of increasing productivity. Further, it is preferable to select the minimized types of masks for use.

The detailed embodiments of the present invention have been explained. The foregoing exemplary embodiments and advantages are merely exemplary and are not to be construed as limiting the exemplary embodiments. It should thus be understood that various modifications and changes are possible by those skilled in the art without departing from the core concept of the present invention.

For example, the polyhedron cells may be realized into shapes that are not limited to the embodiments provided herein. Additionally, the specific types of the masks to realize the polyhedron cells as disclosed in the embodiments, shapes of arrangement thereof, and directions of ultraviolet radiation may be realized based on the technical concept of the present invention as disclosed in the claims, by the manner other than those disclosed in FIGS. 13 to 24.

Further, regarding ultraviolet radiation plane with respect to liquid photosensitive resin having hexahedron volume, beside the 1- or 2-plane radiation of the embodiments, the 3-plane radiation is also possible.

Meanwhile, the so-called maskless lithography technology, which directly exposes the photosensitive resins using ultraviolet rays focused into thin beam form, ultraviolet laser, electron beams or ion beams, is known as a method for increasing precision or facilitating modification of circuits in semiconductor integrated circuit process (R. Menon et al., Materials Today, Feb. 2005, pp. 26-33), and this technology can be advantageously employed in the present invention to form solid resin structure. That is, in the embodiments described above, the masks are selected to induce ultraviolet beams which are polyhedron in cross section in the liquid photosensitive resin. With the maskless lithography, it is possible to partially harden the liquid resin by projecting ultraviolet rays in the repeating polygonal patterns identical to the mask pattern of the embodiments to the liquid photosensitive resin.

Further, it is possible to form the thin film into multilayered structure by adding homogeneous or different materials to the first coating, to thus reinforce the cell structure or impart additional function. In the above example, chemical, physical or thermal, post-processing may preferably be performed to induce diffusion, chemical reaction or alloying phenomenon between coated or plated layers, thus mitigating stress generated between thin film layers or increasing resistance against layer separation. For example, when ceramic layer such as silicone is coated after first metal plating, the difference in the coefficient of thermal expansion between the two materials causes stress which in turn causes interlayer separation. However, it is possible to mitigate interlayer stress focusing by causing diffusion between the metal layer and the ceramic layer as this will result in so-called gradient material.

Further, it is possible to minimize weight increase and enhance strength, by filling the empty spaces within the resultant polyhedron structures with the porous material after the process described above is finished, or after the thin film is formed in the engraved resin and before or after removal of the external solid resin, thus forming a certain type of hierarchical structure consisting of polyhedron structures and smaller cell structures. In the above example, the empty spaces within the polyhedron structure may include one or both of the inner space as occupied by the hollow polyhedron unit cells and the outer space.

Accordingly, all these changes and modifications may be understood to correspond to the scope of the invention as disclosed in the claims or equivalents thereof.

What is claimed is:
1. A method for forming an ultra-low density three-dimensional thin film structure made of a solid thin film, the method comprising the steps of:
hardening a portion of a liquid photosensitive resin bulk as a solid photosensitive resin structure using self propagating phenomenon by radiating ultraviolet rays of different patterns in respective predetermined directions to the portion of the liquid photosensitive resin bulk such that the portion of the liquid photosensitive resin bulk are cured as the solid photosensitive resin structure by the radiated ultraviolet rays
removing the liquid photosensitive resin which is not hardened and leaving the solid photosensitive resin structure;
coating a surface of the solid photosensitive resin structure with a thin film;
removing a portion of the thin film coated on a distal end of the solid photosensitive resin structure so as to expose the distal end of the solid photosensitive resin; and
removing the solid photosensitive resin structure through the removed portion of the thin film,
wherein each of the different patterns has a structure in which predetermined polygonal shapes are arranged in the vicinity of and alternately with each other, wherein the solid photosensitive resin structure has a structure in which a plurality of prisms intersects with each other, and wherein the ultra-low density three-dimensional thin film structure has a structure in which hollow polyhedron unit cells having surfaces with a flat surface element are interconnected and repeatedly formed, thus enabling the ultra-low density three-dimensional thin film structure to be formed into an engraved structure relative to the solid photosensitive resin structure.

2. The method of claim 1, wherein the radiating the ultraviolet rays uses one or more masks with different patterns to each other.

3. The method of claim 1, wherein the radiating the ultraviolet rays uses maskless lithography technique.

4. The method of claim 1, wherein the radiating the ultraviolet rays is performed only on a specific plane of the liquid photosensitive resin bulk, according to respective patterns and in respective designated directions.

5. The method of claim 1, wherein the radiating the ultraviolet rays is performed on two or more planes of the liquid photosensitive resin bulk, according to respective patterns and in respective designated directions.

6. The method of claim 1, wherein the thin film is metal, ceramic or polymer.

7. The method of claim 1, wherein the step of coating the surface of the solid photosensitive resin structure with the thin film comprises forming a multilayered thin film by repeatedly performing coating a thin film with a homogeneous or heterogeneous material.

8. The method of claim 7, after the multilayered thin film is formed, further comprising a chemical, physical or thermal post-processing to mitigate interlayer stress or to suppress interlayer separation.

9. The method of claim 1, wherein either an inner space as occupied by the hollow polyhedron unit cells or an outer space, or both is filled with a porous material.

10. The method of claim 1, wherein the removing the thin film from the outermost surface of the resin bulk is performed in a mechanical polishing, electrolytic polishing or chemical etching manner.

11. The method of claim 1, wherein the removing the solid photosensitive resin structure is performed in one of chemical, physical, thermal and optical methods.

12. The method of claim 1, wherein the unit cells are one of tetrahedron, cube, octahedron, vector equilibrium, rhombic dedecahedron, and Kagome.

* * * * *